(12) United States Patent
Nakamura

(10) Patent No.: US 8,839,513 B2
(45) Date of Patent: *Sep. 23, 2014

(54) CONCAVE CONNECTOR SUBSTRATE, METHOD OF MANUFACTURING THE SAME, MEASURING KIT, SENSOR SUBSTRATE, AND SENSOR SUBSTRATE INTERPOLATED CYLINDER

(71) Applicant: Hitachi Chemical Company, Ltd., Tokyo (JP)

(72) Inventor: Hidehiro Nakamura, Tsukuba (JP)

(73) Assignee: Hitachi Chemical Company, Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/963,463

(22) Filed: Aug. 9, 2013

(65) Prior Publication Data

US 2013/0318786 A1 Dec. 5, 2013

Related U.S. Application Data

(62) Division of application No. 12/762,510, filed on Apr. 19, 2010, now Pat. No. 8,535,623.

(30) Foreign Application Priority Data

Apr. 21, 2009 (JP) ................ P2009-103139

(51) Int. Cl.
*H05K 13/00* (2006.01)

(52) U.S. Cl.
USPC ................ 29/876; 439/62; 439/177

(58) Field of Classification Search
CPC .......... H05K 2201/09081; H05K 2201/09063; H05K 2201/058; H05K 2203/167; H05K 1/028; H05K 1/118; H01R 12/91
USPC ............ 439/177, 77, 594, 595, 377, 62, 516; 156/221

See application file for complete search history.

(56) References Cited

U.S. PATENT DOCUMENTS 4,026,011 A * 5/1977 Walton ........................... 29/846
5,761,795 A * 6/1998 Ohta .............................. 29/739

(Continued)

FOREIGN PATENT DOCUMENTS

| JP | 4-334887 | 11/1992 |
| JP | 2004-335547 | 11/2004 |

(Continued)

OTHER PUBLICATIONS

Communication mailed Nov. 12, 2013, in connection with Japanese Patent Application No. 2010-097740, 3 pages; Japanese Patent Office, Japan.

*Primary Examiner* — Michael Orlando
*Assistant Examiner* — Marta Dulko
(74) *Attorney, Agent, or Firm* — Antonelli, Terry, Stout & Kraus, LLP.

(57) ABSTRACT

A method of manufacturing a concave connector substrate includes: a step of preparing a guide substrate having a guide/holding region that guides a plate-shaped connector to a connection position and a cut portion; a step of arranging and aligning two wiring substrates, each having wiring lines and through hole connection portions that are electrically connected to the wiring lines, with both surfaces of the guide substrate, and applying an adhesive to a predetermined region of the guide substrate to bond the wiring substrates to the guide substrate; a step of bending a portion of the wiring substrate toward the inside of the cut portion of the guide substrate and bringing the wiring lines disposed in the bent portion into pressure contact with the inside of the cut portion; and a step of removing a section inside the cut portion to form the guide/holding region.

5 Claims, 25 Drawing Sheets

(56) References Cited

U.S. PATENT DOCUMENTS

| | | | |
|---|---|---|---|
| 5,844,783 A * | 12/1998 | Kojima | 361/777 |
| 6,444,921 B1 * | 9/2002 | Wang et al. | 174/260 |
| 7,227,537 B2 * | 6/2007 | Nakayama et al. | 345/173 |
| 7,232,315 B2 | 6/2007 | Uchida et al. | |
| 7,641,610 B2 * | 1/2010 | Nakamura et al. | 600/132 |
| 7,719,627 B2 * | 5/2010 | Okuda | 349/58 |
| 7,731,527 B2 * | 6/2010 | Hiramatsu | 439/571 |
| 7,874,848 B2 * | 1/2011 | Nakamura | 439/67 |
| 7,936,565 B2 * | 5/2011 | Muro et al. | 361/749 |
| 7,955,101 B2 * | 6/2011 | Lawson et al. | 439/177 |
| 8,134,840 B2 * | 3/2012 | Yoshida et al. | 361/752 |
| 8,535,623 B2 * | 9/2013 | Nakamura | 422/544 |
| 2008/0249363 A1 * | 10/2008 | Nakamura et al. | 600/132 |
| 2009/0161331 A1 * | 6/2009 | Sato et al. | 361/803 |

FOREIGN PATENT DOCUMENTS

| | | |
|---|---|---|
| JP | 2005-032446 | 2/2005 |
| JP | 2006-192202 | 7/2006 |
| WO | WO 2009/041554 | 4/2009 |

* cited by examiner

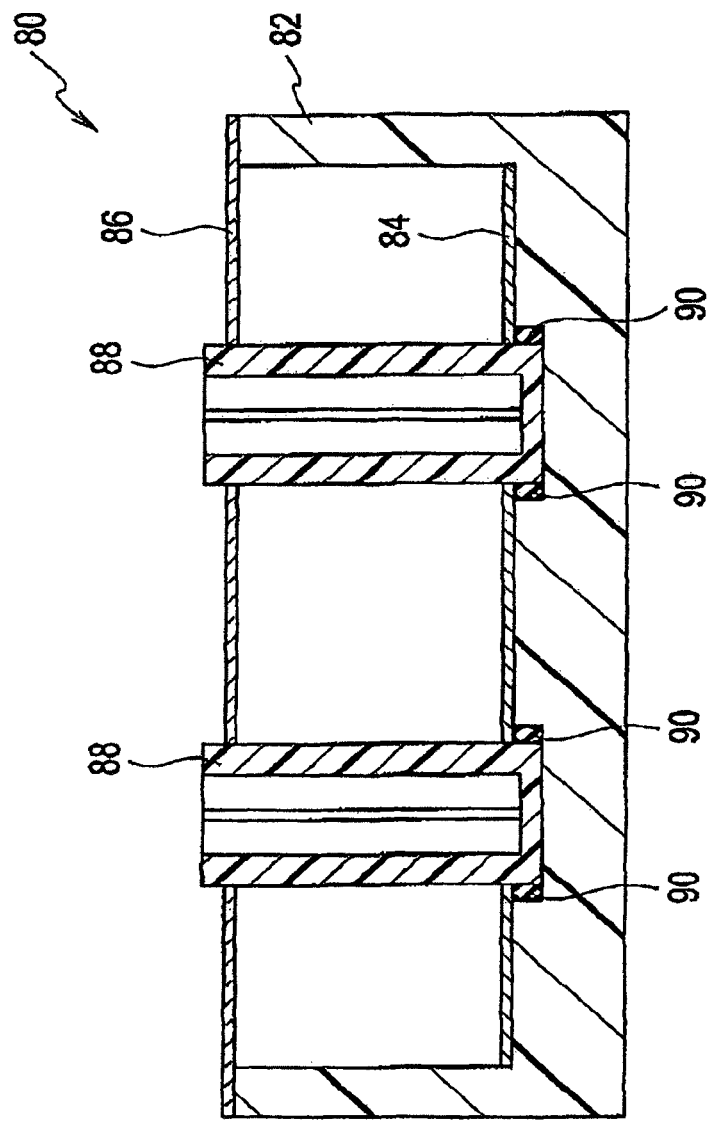

CONCAVE CONNECTOR SUBSTRATE, METHOD OF MANUFACTURING THE SAME, MEASURING KIT, SENSOR SUBSTRATE, AND SENSOR SUBSTRATE INTERPOLATED CYLINDER

CLAIM OF PRIORITY

This application is a divisional of application Ser. No. 12/762,510, filed on Apr. 19, 2010, now allowed, which claims priority from Japanese Application No. P2009-103139, filed Apr. 21, 2009, in the Japanese Patent Office. The contents of U.S. Ser. No. 12/762,510 are incorporated herein by reference in their entirety.

TECHNICAL FIELD

The present invention relates to a concave connector substrate into which a substrate, a card, or a chip electrically connected to a system is inserted in a card edge type, a method of manufacturing the same, a measuring kit, a sensor substrate, and a sensor substrate interpolated cylinder.

BACKGROUND ART

With an increase in the degree of integration or the processing speed of semiconductor devices and a reduction in power consumption, the development of small and high-performance information communication apparatuses, such as mobile phone, electronic dictionaries, and digital video cameras has been accelerated. Various kinds of memory cards including memory devices for storing information can be inserted into or removed from the mobile apparatuses in a card edge type (for example, see Patent Document 1). USB-type (Universal Serial Bus) concave connectors that are mainly used in personal computers as well as card-insertion-type concave connectors have been utilized in order to control peripheral devices each other, such as a printer, a mouse, and a measuring device. In recent years, internationally standardized concave connectors for connection to parts mounting LEDs that have been developed have drawn attention. In a flexible rigid plate in which a flexible rigid substrate is used in a common inner layer in order to connect multi-layered printed circuit boards each other, a structure has been proposed in which a concave connection portion is provided in the multi-layered substrate, not the common inner layer (for example, see Patent Document 2).

PRIOR TECHNICAL DOCUMENT

Patent Document

Patent Document 1: Japanese Patent Application Laid-Open (JP-A) No. 2005-32446

Patent Document 2: JP-A No. 2004-335547

DISCLOSURE OF THE INVENTION

Problems to be Solved by the Invention

In the system in which a connector unit (convex type), such as an electrochemical measurement substrate, a memory card, or a sensor chip, is inserted into a connector (concave) that is concave and convex with respect to the connector unit so as to be electrically connected thereto, a concave connector formed by the manufacture of a case using a precision mold, the mechanical processing of terminal leads, and a packaging process for them is needed in order to accurately fit the connectors. However, it is difficult to reduce the manufacturing costs of the concave connector when responding to small quantity batch production. In the design of the thickness of a substrate, a card, or a chip to be inserted or connection terminals, the flexibility of the design is restricted by the specifications of the concave connector.

The invention has been made in order to solve the above-mentioned problems and an object of the invention is to provide a method of manufacturing a concave connector substrate in which connector terminals and cables are integrated with each other and which can ensure the flexibility of the design of a convex connector to be inserted and achieve high strength, high-accuracy connection, and low manufacturing costs.

Another object of the invention is to provide a method of manufacturing a concave connector substrate in which connector terminals, cables, and through hole connection portions are integrated with each other and which can ensure the flexibility of the design of a convex connector to be inserted and achieve high strength, high-accuracy connection, and low manufacturing costs.

Still another object of the invention is to provide a concave connector substrate that can be easily bent or a concave connector substrate that can be easily bent and hold the bent position, and a measuring kit, a sensor substrate, and a sensor substrate interpolated cylinder that are suitable for the use of the concave connector substrate.

Means for Solving the Problems

In order to solve the above-mentioned problems, the inventors have found a structure in which connector terminals and cables are integrated with each other and which has the flexibility of the design of a convex connector to be inserted and has high connection accuracy and low manufacturing costs and a method of manufacturing the same.

The invention is as follows.

(1) A method of manufacturing a concave connector substrate comprising:

preparing a guide substrate having a guide/holding region that guides a plate-shaped connector provided with an electronic device to be connected to a connection position and holds the plate-shaped connector at the connection position and a cut portion for removing a section having a shape corresponding to the guide/holding region on at least one side;

arranging and aligning two wiring substrates, each having wiring lines obtained by integrating connector terminals with cables and through hole connection portions that are electrically connected to the wiring lines, with both surfaces of the guide substrate such that one surface having the wiring lines and the through hole connection portions formed thereon faces the guide substrate and one side of the guide substrate having the cut portion formed therein faces the connector terminals, and applying an adhesive to a region of the guide substrate other than the inside of the cut portion to bond the wiring substrates to the guide substrate;

bending a portion of the wiring substrate toward the inside of the cut portion of the guide substrate and bringing the wiring lines disposed in the bent portion into pressure contact with the inside of the cut portion; and removing a section inside the cut portion to form the guide/holding region.

(2) The method of manufacturing a concave connector substrate according to above-mentioned (1), wherein pins are uprightly provided in the through hole connection portions.

(3) A method of manufacturing a concave connector substrate comprising:

preparing a guide substrate having a guide/holding region that guides a plate-shaped connector provided with an electronic device to be connected to a connection position and holds the plate-shaped connector at the connection position and a cut portion for removing a section having a shape corresponding to the guide/holding region;

arranging and aligning two wiring substrates, each having wiring lines obtained by integrating connector terminals with cables, a metal layer that is provided on one surface opposite to the surface having the wiring lines formed thereon, and a window that is provided in a region of the metal layer facing the connector terminals, with both surfaces of the guide substrate such that the surface having the wiring lines formed thereon faces the guide substrate, and applying an adhesive to a region of the guide substrate other than the inside of the cut portion to bond the wiring substrates to the guide substrate;

pressing a base surface of the wiring substrate exposed from the window to bend the wiring substrate and bringing the wiring lines disposed in the bent portion into pressure contact with the inside of the cut portion; and removing a section inside the cut portion to form the guide/holding region, wherein the thickness of the section of the guide substrate is set to be less than the maximum thickness of the plate-shaped connector.

(4) The method of manufacturing a concave connector substrate according to above-mentioned (3), wherein a dummy conductor pattern corresponding to a conductor pattern of the plate-shaped connector is formed in the section of the guide substrate, and a portion of or the entire dummy conductor pattern in the section of the guide substrate is removed.

(5) The method of manufacturing a concave connector substrate according to above-mentioned (3), wherein a dummy conductor pattern corresponding to a conductor pattern of the plate-shaped connector is formed in the section of the guide substrate, and the thickness of the dummy conductor pattern in the section of the guide substrate is less than that of the conductor pattern of the plate-shaped connector.

(6) The method of manufacturing a concave connector substrate according to any one of above-mentioned (3) to (5), wherein a plate-shaped low-elasticity base is provided outside the wiring substrate in a laminated direction, and the base surface of the wiring substrate exposed from the window is pressed through the plate-shaped low-elasticity base to bend the wiring substrate.

(7) The method of manufacturing a concave connector substrate according to any one of above-mentioned (1) to (5), wherein the wiring substrate is obtained by forming wiring lines on a base made of a thermosetting resin, a light-curable resin, or a thermoplastic resin.

(8) A concave connector substrate that is manufactured by the method of manufacturing a concave connector substrate according to any one of above-mentioned (1) to (5) and has flexibility, comprising:

cut portions that are provided on both sides of the concave connector substrate in a width direction orthogonal to a direction in which wiring lines extend and form non-compliant regions which do not follow bending when the concave connector substrate is bent at the center in the direction in which the wiring lines extend, wherein the cut portions are set to a size that allows one end of the concave connector substrate to be engaged with the non-compliant regions when the concave connector substrate is bent in a substantially U shape, and the concave connector substrate includes a locking means that engages the non-compliant regions with the one end of the concave connector substrate and locks the non-compliant regions at the engagement position.

(9) The concave connector substrate according to above-mentioned (8), wherein the locking means includes cutouts that are formed in the concave connector substrate and the non-compliant regions and are engaged with each other.

(10) The concave connector substrate according to above-mentioned (8), wherein the locking means includes protruding portions that are formed in the non-compliant regions and engaging holes that are formed in the concave connector substrate and are engaged with the protruding portions.

(11) A measuring kit that is used to measure a sample using a sensor with a connector which is obtained by inserting a sensor substrate into the guide/holding region of the concave connector substrate according to above-mentioned (8), comprising:

a cylinder into which the sensor substrate and a sample to be measured are introduced; and a barrel-shaped case body in which the cylinder is provided, wherein a groove with the bottom to which the bottom of the cylinder is fitted is formed in an inner bottom of the case body, and cutouts that hold the sensor substrate and extend from an opening portion to the bottom of the cylinder are formed in an inner wall of the cylinder.

(12) The measuring kit according to above-mentioned (11), wherein an O-ring to which the cylinder is fitted is provided in the groove with the bottom.

(13) The measuring kit according to above-mentioned (12), further comprising:

a plate-shaped member that covers the inner bottom of the case body, wherein the plate-shaped member has an opening portion through which the cylinder passes to lock the O-ring.

(14) The measuring kit according to above-mentioned (13), wherein the plate-shaped member is made of a metal material and has a heat dissipation property.

(15) A sensor substrate that is inserted into the guide/holding region of the concave connector substrate according to above-mentioned (8), comprising:

a concave portion that is provided in a surface; and three electrodes corresponding to a working electrode, a counter electrode, and a reference electrode that are formed in the concave portion.

(16) The sensor substrate according to above-mentioned (15), wherein wiring lines connected to the three electrodes are buried in the sensor substrate without being exposed from the surface.

(17) A sensor substrate interpolated cylinder comprising:

a sensor substrate that is inserted into the guide/holding region of the concave connector substrate according to above-mentioned (8); and a cylinder into which the sensor substrate is inserted, wherein the cylinder includes a sample feed port through which a sample is introduced into the cylinder and a sealing means that seals an opening portion of the cylinder and the sensor substrate.

Effect of the Invention

According to the invention, it is possible to provide a method of manufacturing a concave connector substrate in which connector terminals and cables are integrated with each other and which can ensure the flexibility of the design of a convex connector and achieve high strength, high-accuracy connection, and low manufacturing costs.

According to the invention, it is possible to provide a method of manufacturing a concave connector substrate in which connector terminals, cables, and through hole connection portions are integrated with each other and which can ensure the flexibility of the design of a convex connector to be inserted and achieve high strength, high-accuracy connection, and low manufacturing costs.

According to the invention, it is possible to provide a concave connector substrate that can be easily bent or a concave connector substrate that can be easily bent and hold the bent position, and a measuring kit, a sensor substrate, and a sensor substrate interpolated cylinder that are suitable for the use of the concave connector substrate.

BRIEF DESCRIPTION OF THE DRAWINGS

FIG. 24 is a cross-sectional view illustrating the measuring kit shown in FIG. 23 taken along a pair of cylinders.

BEST MODE FOR CARRYING OUT THE INVENTION

Hereinafter, exemplary embodiments of the invention will be described with reference to the accompanying drawings. First, a guide substrate according to the invention will be described.

<Guide Substrate>

The guide substrate according to the invention has a guide/holding region that guides a plate-shaped connector of an electronic device to be connected to a connection position and holds the plate-shaped connector at the connection position and is used to manufacture a concave connector. The guide substrate includes a cut portion for removing a section having a shape corresponding to the guide/holding region. The guide substrate is used to manufacture a concave connector substrate according to the invention, which will be described below.

The concept of the 'electronic device' includes, for example, a substrate, a card, and a sensor chip that are inserted into or removed from the corresponding concave connectors. The 'plate-shaped connector' is a portion of the electronic device and includes a plate-shaped connection portion that is inserted into an insertion portion of the concave connector when it is connected to the concave connector.

Figure 1:
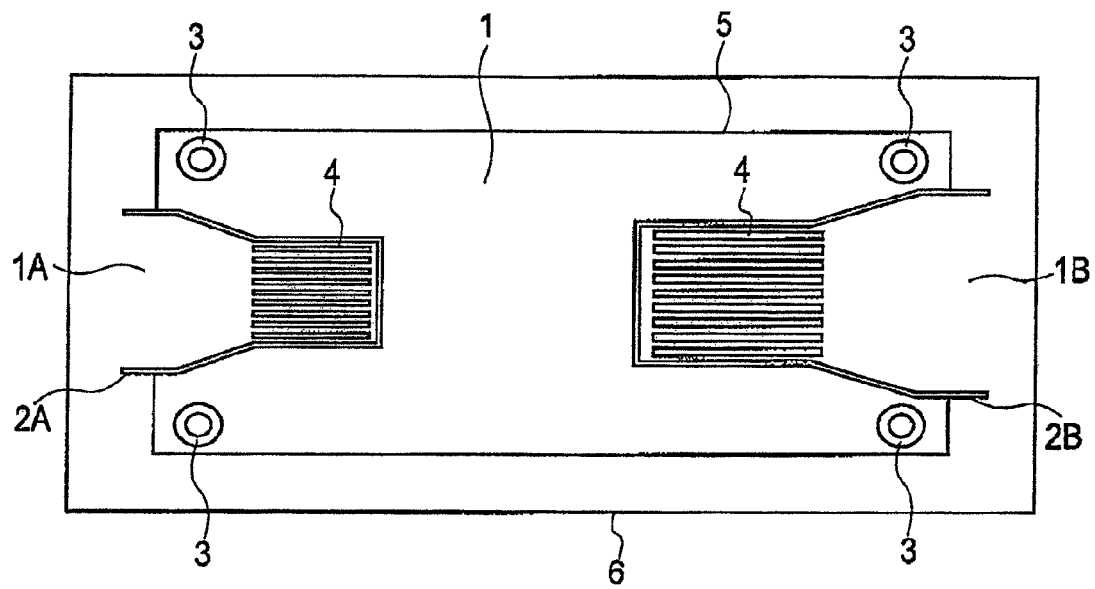
FIG. 1 is a top view illustrating the structure of a guide substrate according to the invention.

FIG. 1 is a diagram illustrating the structure of a base 1 for manufacturing the guide substrate.

In FIG. 1, reference numeral 5 in the base 1 indicates an outline along which the base 1 is cut into the guide substrate after a laminating process is completed. Reference numeral 6 indicates a region in which data for arranging a plurality of individual products on a predetermined substrate is designed. In the region represented by the reference numeral 6, two cut portions for removing sections having a shape corresponding to the guide/holding regions that guide a plate-shaped connector of an electronic device to be connected to a connection position and hold the plate-shaped connector at the connection position are provided on the left and right sides (2A and 2B). At the connection position of the electronic device, connector terminals of the concave connector substrate contact connection terminals of the inserted plate-shaped connector and are electrically connected and fixed thereto.

It is preferable to set the thickness of the guide substrate in consideration of the thickness of the plate-shaped connector that is used. As described above, the guide substrate is used to form the guide/holding region. Therefore, it is preferable that the thickness of the guide substrate correspond to the thickness of the plate-shaped connector inserted into the guide/holding region. When the thickness of the guide substrate is selected in consideration of the thickness of the plate-shaped connector that is used, it is possible to form a guide/holding region with a desired spatial shape.

Specifically, it is preferable that the thickness of the guide substrate be set to be equal to the maximum thickness of the plate-shaped connector. For example, when only the connection terminal portion of the plate-shaped connector that is used is inserted into the guide/holding region, it is preferable that the thickness of the guide substrate be equal to that of the connection terminal portion. When a portion that is thicker than the connection terminal portion exists in the plate-shaped connector and the portion is also inserted into the guide/holding region, for example, when a protective film (coverlay) is formed in addition to the connection terminal portion or when a semiconductor chip or a resistive element is mounted, it is preferable that the thickness of the guide substrate be equal to that of a portion in which the protective film is provided.

That the thickness of the guide substrate is "equal to" that of the plate-shaped connector does not means that the thickness of the guide substrate is completely equal to that of the plate-shaped connector, but means that the thickness of the guide substrate is substantially equal to that of the plate-shaped connector.

The above-mentioned thickness relationship is not established when the connection strength between the concave connector of the concave connector substrate and the plate-shaped connector is increased.

The guide/holding region is for removing the regions (sections) that are represented by reference numerals 1A and 1B and are disposed inside the cut portions 2A and 2B of the base 1 in a laminating process for manufacturing the concave connector and may be include the cut portions represented by the reference numerals 2A and 2B in FIG. 1. The cut portions 2A and 2B can be formed by a cutting operation of a router. According to this method, it is possible to process two or more substrates at the same time and thus improve productivity. In this case, the guide/holding region for aligning and inserting the outline of plate-shaped connector of the electronic device which is inserted or removed while guiding the plate-shaped connector to the connection position is formed inside the cut line 5.

The width of the cut portion is appropriately set according to circumstances in order to prevent the portions of the guide substrate represented by the reference numerals 1A and 1B from not being separated due to an adhesive flowing into the cut portion when the guide substrate and the wiring substrate are bonded to each other, which will be described below. It is more preferable that the width of the cut portion be set in consideration of the gap from both terminals to the outline of the substrate.

The guide substrate shown in FIG. 1 has positioning guide patterns 3 that are provided in the substrate 1 by etching at four positions. Drilled holes are formed in the positioning guide patterns 3, and wiring substrates, each having wiring lines obtained by integrating connector terminals and cables, are laminated on both sides of the substrate 1 with an adhesive interposed therebetween while being aligned with the substrate 1, using the drilled holes. In this case, the diameter of the drilled hole may be, for example, in the range of 2 mm to 4 mm.

When the guide substrate is manufactured by allocating a plurality of guide substrates to one large substrate, it is not necessary to provide the positioning guide patterns at four corners of each guide substrate, but the positioning guide patterns may be provided at four corners of the one large substrate.

Figure 8:
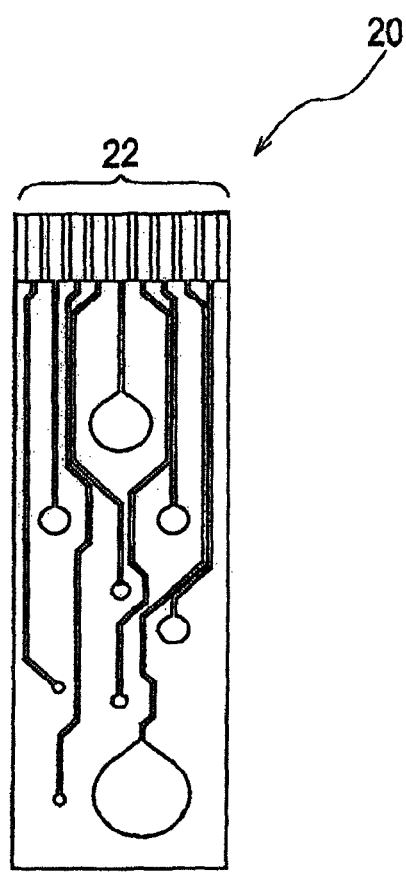
FIG. 8 is a diagram illustrating the pattern of a sensor substrate that can be used in the concave connector substrate according to the invention.

Dummy electrode terminal patterns 4 corresponding to the connection terminal portion that is provided in the plate-shaped connector of the electronic device to be inserted or removed are formed inside the cut portions 2A and 2B, that is, on both surfaces of the sections 1A and 1B. The dummy electrode terminal patterns 4 may be formed by wiring etching or plating, or may be printed insulating patterns with conductivity or heat resistance. It is preferable that the dummy electrode terminal patterns be made of the same material as that forming the connection terminal portion of the plate-shaped connector in terms of adopting actual use. In order to improve connection strength to the plate-shaped connector, it is effective that the dummy electrode terminal patterns 4 are not formed. However, the connection terminal portion may not be removed. Therefore, it is necessary to provide appropriate dummy electrode terminal patterns. Patterns or solid patterns may be provided. The guide substrate shown in FIG. 1 is used to insert or remove a sensor substrate (a single-sided wiring flexible substrate reinforced by a glass epoxy substrate) 20 shown in FIG. 8 as an electronic device, and a wiring pattern corresponding to the terminal portion (plate-shaped connector) 22 can be formed by the above-mentioned etching process. Terminals of the sensor substrate 20 shown in FIG. 8 are arranged at a pitch of 1.0 mm, the width of the wiring line is 0.65 mm and the gap between the wiring lines is 0.35 mm. The gap from the terminals provided on both sides to the outline of the substrate is 0.675 mm, respectively. Therefore, the width of the cut portion needs to be less than 0.675 mm. When the reference flexible substrate shown in FIG. 8 is used as an electronic device, it is preferable that the connection terminal patterns 4 of the guide substrate be formed by gold plating.

As the base 1 shown in FIG. 1, for example, a copper-clad laminate (glass epoxy substrate) manufactured by Hitachi Chemical Co., Ltd. or Japan Gore-Tex Inc. (liquid crystal polymer substrate) is used. The substrate with a thickness of 0.3 mm may be cut into a size that is used during a process and subjected to a resist laminate, exposure, development, and copper etching. Then, the patterns may be directly plated with gold. The plating thickness may be, for example, in the range of 0.3 μm to 0.6 μm.

<Concave Connector Substrate and Method of Manufacturing the Same>

Next, a concave connector substrate manufactured using the above-mentioned guide substrate and a method of manufacturing the concave connector substrate will be described.

A first aspect of a method of manufacturing a concave connector substrate according to the invention includes: a process of preparing a guide substrate having a guide/holding region that guides a plate-shaped connector of an electronic device to be connected to a connection position and holds the plate-shaped connector at the connection position and a cut portion for removing a section having a shape corresponding to the guide/holding region on at least one side; a process of arranging and aligning two wiring substrates, each having wiring lines obtained by integrating connector terminals with cables and through hole connection portions that are electrically connected to the wiring lines, with both surfaces of the guide substrate such that one surface having the wiring lines and the through hole connection portions formed thereon faces the guide substrate and one side of the guide substrate having the cut portion formed therein faces the connector terminals, and applying an adhesive to a region of the guide substrate other than the inside of the cut portion to bond the wiring substrates to the guide substrate; a process of bending a portion of the wiring substrate toward the inside of the cut portion of the guide substrate and bringing the wiring lines disposed in the bent portion into pressure contact with the inside of the cut portion; and a process of removing a section inside the cut portion to form the guide/holding region.

A second aspect of a method of manufacturing a concave connector substrate according to the invention includes: a process of preparing a guide substrate having a guide/holding region that guides a plate-shaped connector of an electronic device to be connected to a connection position and holds the plate-shaped connector at the connection position and a cut portion for removing a section having a shape corresponding to the guide/holding region; a process of arranging and aligning two wiring substrates, each having wiring lines obtained by integrating connector terminals with cables, a metal layer that is provided on one surface opposite to the surface having the wiring lines formed thereon, and a window that is provided in a region of the metal layer opposite to the connector terminals, with both surfaces of the guide substrate such that the surface having the wiring lines formed thereon faces the guide substrate, and applying an adhesive to a region of the guide substrate other than the inside of the cut portion to bond the wiring substrates to the guide substrate; a process of pressing a base surface of the wiring substrate exposed from the window to bend the wiring substrate and bringing the wiring lines disposed in the bent portion into pressure contact with the inside of the cut portion; and a process of removing a section inside the cut portion to form the guide/holding region. The thickness of the section of the guide substrate is set to be less than the maximum thickness of the plate-shaped connector.

Next, first, the common point between the methods of manufacturing the concave connector substrate according to the first and second aspects of the invention will be described.

Figure 2:
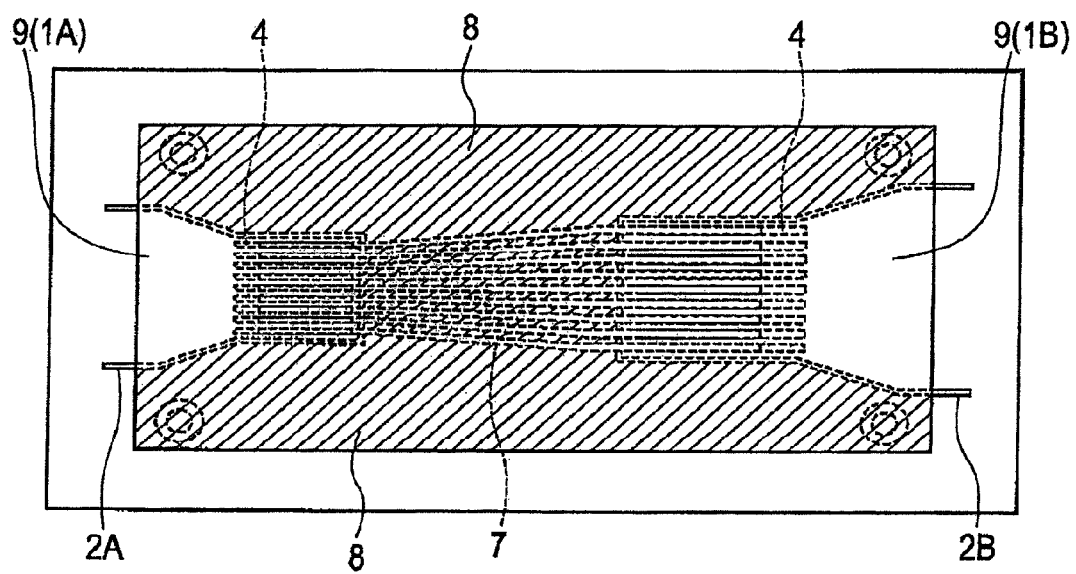
FIG. 2 is a top view illustrating the structure of a concave connector substrate according to the invention.

When the concave connector substrate is manufactured, first, two wiring substrates, each having the wiring lines obtained by integrating the connector terminals with the cables, are arranged and aligned with the above-mentioned guide substrate such that one surface having the wiring lines formed thereon faces the guide substrate and then adhered to the guide substrate. FIG. 2 is a diagram illustrating a structure in which wiring substrates 8 having wiring lines 7 obtained by integrating the connector terminals with the cables are adhered to both surfaces of the base (guide substrate) 1. FIG. 2 shows only one surface (front surface), but the wiring substrate is similarly adhered to a surface (rear surface) opposite to the one surface.

Specifically, FIG. 2 shows a state in which the wiring substrates 8 having the wiring lines which are represented by reference numeral 7 and are obtained by integrating the connector terminals with the cables are adhered to both surfaces of the base 1 shown in FIG. 1 such that the wiring lines 7 face at least the inside, that is, the wiring lines 7 face the surface of the guide substrate. An adhesive (adhesive sheet) for bonding the wiring substrates 8 to the guide substrate is applied between the layers of the wiring substrates 8 and the guide substrate, and a region in which the adhesive is applied is hatched in FIG. 2. The hatched region shown in FIG. 2 is a minimum region for applying the adhesive, and the adhesive may be applied to regions other than the hatched region. That is, it is preferable that the adhesive sheet have the same size as the guide substrate and the wiring substrates in terms of manufacturing efficiency. In this case, the adhesive is applied to regions other than the hatched region shown in FIG. 2. However, since the sections 1A and 1B need to be removed in the subsequent process, the adhesive is not applied to sections 1A and 1B that are disposed inside the cut portions of the guide substrate. In this case, for example, alignment may be performed by inserting guide pins with a diameter of φ 2.0 into the holes that are formed in advance in the adhesive sheet (adhesive) at positions corresponding to the positioning guide patterns (having holes with a diameter of ϕ 2.0) represented by reference numeral 3 in FIG. 1 to position the adhesive sheet. After the adhesive sheet is arranged, the adhesive sheet (adhesive) is temporarily adhered at its own weight by an iron at a temperature where the adhesive sheet is not cured and then the guide pins are removed. For example, KS7003 (with a thickness of 25 μm) manufactured by Hitachi Chemical Co., Ltd. may be used as the adhesive (adhesive sheet).

In the alignment, it is important to reflect the positional relationship of the adhesive sheet (adhesive) in the cut portion to the design. When the adhesive sheet (adhesive) is heated or pressed to have an adhesive function in the subsequent process, the adhesive sheet flows in the layer direction. However, in the invention, it is preferable that the adhesive sheet (adhesive) be cut in consideration of the amount of flow such that the flow of the adhesive stops outside the cut portion. That is, it is preferable to provide a region in which the adhesive sheet does not adhere in the vicinity of the cut portion in consideration of the amount of flow of the adhesive such that the adhesive in a fluid state does not flow to the cut portion. Alternatively, it is preferable that the adhesive sheet be cut such that, even though the adhesive flows into the cut portion, the adhesive flowing into the cut portion does not hinder the removal of the section having a shape corresponding to the guide/holding region or the insertion of the plate-shaped connector.

Alternatively, it is preferable to select an adhesive sheet (adhesive) with low fluidity in order to prevent the flow of the adhesive in the layer direction. For example, KS7003 (with a thickness of 25 μm) manufactured by Hitachi Chemical Co., Ltd. is given as an example of the adhesive sheet on the market. The use of the adhesive sheet prevents the adhesive from flowing to the cut portion even though the cut portion is formed at a position that is about 250 μm inside from the outer end of the cut portion.

It is preferable that the design and the setting of the manufacturing conditions including all processes, which will be described below, be performed such that, even when the surface along the space to be formed when the sections, which are denoted by the reference numerals 1A and 1B, of the guide substrate becomes the surface along the guide substrate or even when the adhesive protrudes toward the surface, the surface does not constrict the outline of an electronic device to be inserted and does not prevent the insertion of the electronic device.

The temperature most suitable for lamination is in the range of 160° C. to 180° C., and the pressure of the product is in the range of 2 MPa to 4 MPa and preferably equal to or less than 2.5 MPa. The degree of vacuum is equal to or less than $1.33 \times 10^2$ Pa (1.0 torr) and preferably equal to or less than 26.7 Pa (0.2 torr).

Figure 3:
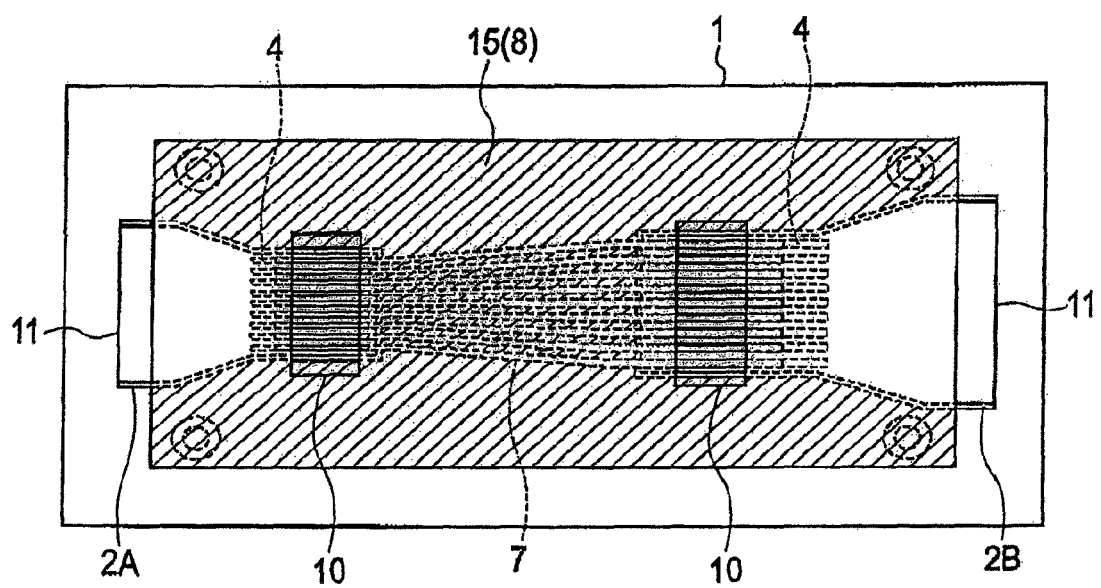
FIG. 3 is a top view illustrating the structure of the concave connector substrate according to the invention.

It is preferable that the wiring substrate be formed by providing metal layers, such as cooper layers, on both surfaces of a base made of, for example, a thermosetting resin, a light-curable resin, or a thermoplastic resin. FIG. 3 is a diagram illustrating a structure in which a metal layer 15 is provided on the outer surfaces of the wiring substrates 8 that are arranged on both surfaces of the guide substrate and base deforming windows (windows) 10 are provided in the metal layer 15. The base deforming window 10 will be described below.

As the thermosetting resin, one or more resins selected from the following resins may be used: an epoxy resin; a Bismaleimide-Triazine resin; a polyimide resin; a cyanoacrylate resin; a phenol resin; an unsaturated polyester resin; a melamine resin; a urea resin; a polyisocyanate resin; a furan resin; a resorcinol resin; a xylene resin; a benzoguanamine resin; a diallyl phthalate resin; a silicon-modified epoxy resin; a silicon-modified polyamide-imide resin; and a benzocyclo cyclobutene resin. If necessary, a material obtained by heating a mixture of any of the resins and a hardening agent or a hardening accelerator thereof to partially harden or completely harden the mixture may be used. It is preferable to use the glass epoxy resin among the above-mentioned resins.

As the light-curable resin, one or more resins selected from the following resins may be used: an unsaturated polyester resin; a polyester acrylate resin; a urethane acrylate resin; a silicon acrylate resin; and an epoxy acrylate resin. If necessary, a material obtained by exposing or heating a mixture of any of the resins and a photoinitiator, a hardening agent, or a hardening accelerator thereof to partially harden or completely harden the mixture may be used.

As the thermoplastic resin, one or more resins selected from the following resins may be used: a polycarbonate resin; a polysulfone resin; a polyesterimide resin; a thermoplastic polyimide resin; a polytetrafluoroethylene resin; a polyhexafluoropropylene resin; a polyester ether ketone resin; a vinyl chloride resin; a polyethylene resin; a polyamide-imide resin; a polyphenylene sulfide resin; a polyoxybenzoate resin; and a liquid crystal polymer. If necessary, a material obtained by heating a mixture of any of the resins and a hardening agent or a hardening accelerator thereof to partially harden or completely harden the mixture may be used.

The above-mentioned insulating resins may be insulating resin compositions, which are mixtures of different kinds of resins. The insulating resin composition may include an inorganic filler, such as silica or a metal oxide, as a filler. The inorganic filler may be conductive particles, such as nickel, gold, or silver particles, or resin particles obtained by plating these metal materials.

In addition, BIAC-C manufactured by Japan Gore-Tex Inc. may be preferably used as the thermoplastic liquid crystal polymer.

As the metal material used in the metal layer, aluminum, iron, nickel, other metal materials, and alloys thereof may be used in addition to copper. Preferably, electrolytic copper foil or rolled copper foil may be used since the windows, the terminals, and the cables are electrically connected to each other by through hole plating in some cases.

The inner surface of the wiring substrate 8 includes the wiring lines 7 obtained by integrating the cables with the connector terminals which are formed by etching the metal layer, and the outer surface thereof includes the metal layer 15 in which the base deforming windows (windows) 10 are provided in the regions corresponding to the connector terminals. In FIG. 3, portions, which are denoted by reference numeral 10, of the metal layer 15 are etched such that the base deforming window 10 includes a predetermined range of the cut portion. The other portions remain as solid portions that are not etched, and the solid portions serve as a portion maintained to be flat such that the base is not deformed during lamination.

After the wiring substrates 8 and other substrates are laminated on the guide substrate 1, a portion of the guide substrate 1 is cut along an outline extraction line denoted by reference numeral 11 and the section thereof is extracted to form the guide/holding region into which the plate-shaped connector of an electronic device, such as a substrate, a card, or a chip, is inserted. The substrate may be cut along the outline extraction line by a mold or an apparatus using NC data, such as a router, in order to perform processing with high productivity or high designability, such as the formation of a cut portion or a locking hole.

A double-sided copper-clad base obtained by laminating electrolytic cooper foil or rolled cooper foil on both surfaces of a thermoplastic liquid crystal polymer BIAC-C (the thickness of the base: 125 μm) manufactured by Japan Gore-Tex Inc. may be used as the wiring substrate. The thickness of the cooper foil is appropriately selected from 12 μm, 18 μm, and 35 μm in consideration of the design specifications of the connector terminal The cooper foil may be laminated using KS7003 (25 μm) manufactured by Hitachi Chemical Co., Ltd.

Then, portions of the wiring substrate are bent toward the inside of the cut portions of the guide substrate, that is, toward the sections 1A and 1B, and the wiring lines disposed in the bent portions are brought into pressure contact with the surfaces of the sections 1A and 1B. In this case, as described above, when the base deforming windows (windows) 10 are provided in the wiring substrate 8, the portions of the wiring substrates can be easily bent.

Figure 4A:
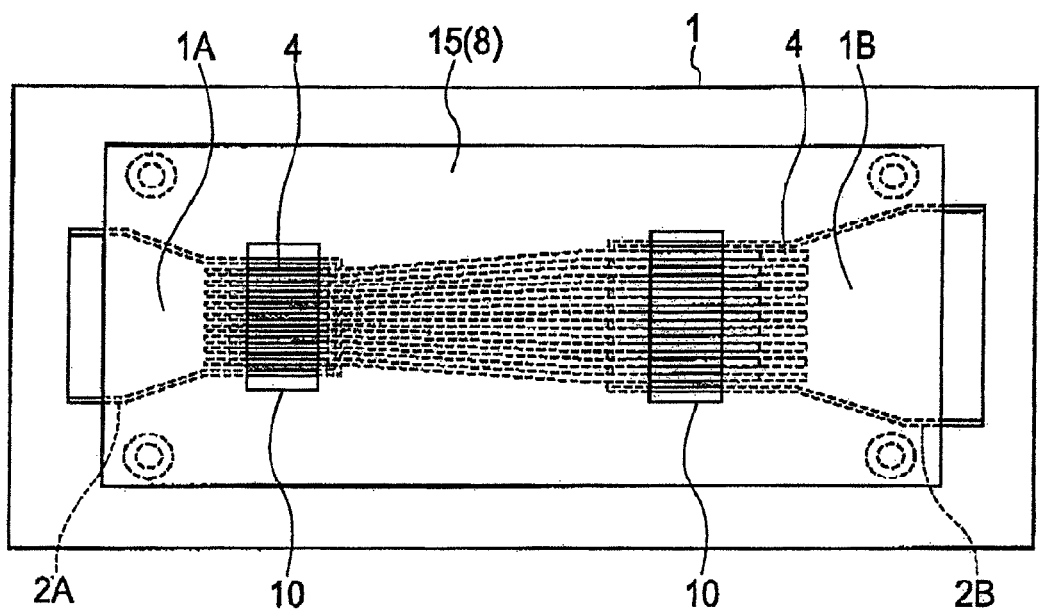
FIG. 4A is a top view illustrating a method of manufacturing the concave connector substrate according to the invention.
Figure 4B:
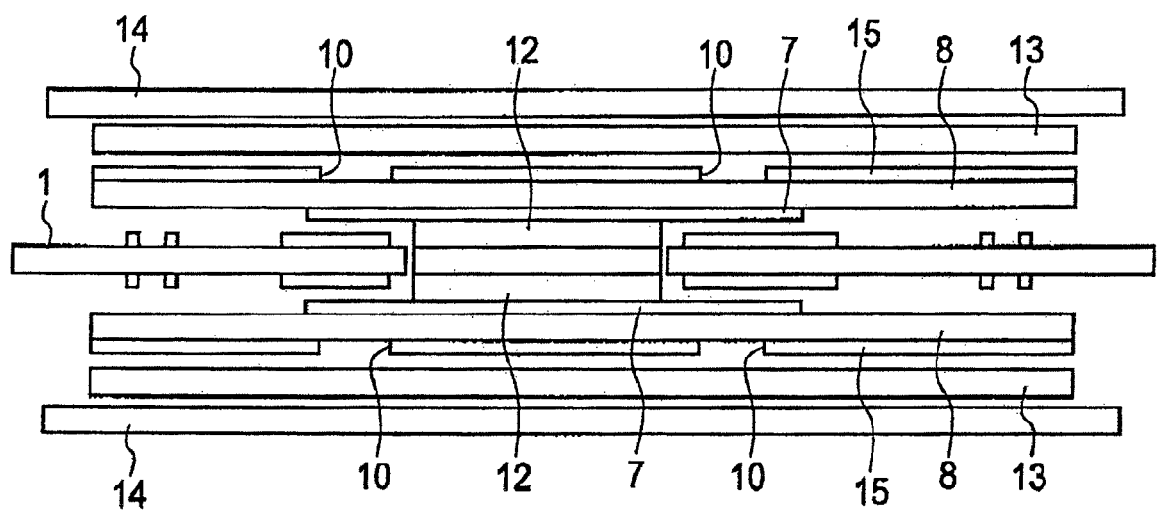
FIG. 4B is a cross-sectional view of a press structure illustrating the method of manufacturing the concave connector substrate according to the invention.

FIGS. 4A and 4B are a top view (FIG. 4A) and a cross-sectional view of a press structure (FIG. 4B) illustrating a process of bringing base portions of the wiring substrates 8 into pressure contact with the guide substrate using cushion members (plate-shaped low-elasticity bases) 13 in a predetermined inner range of the cut portion 2 when the wiring substrates 8 are laminated. That is, FIG. 4A is a top view (a portion is shown in a perspective view) illustrating the laminated substrates (the wiring substrates are laminated on both surfaces of the guide substrate), and FIG. 4B illustrates the arrangement of the cushion members 13 and SUS plates 14 on the laminated substrates and is a cross-sectional view taken along a center line that extends in the longitudinal direction of FIG. 4A. In the cross-sectional view of FIG. 4B, the dummy electrode terminal patterns 4 that do not appear in the actual cross-section is shown for convenience of illustration. During lamination, the cushion member 13 and the SUS plate 14 are sequentially arranged outside the base deforming window 10, that is, in the direction in which the wiring substrates 8 are laminated. Then, the laminated structure obtained by arranging the cushion members 13 and the SUS plates 14 is heated and pressed. That is, the laminated structure is heated at a predetermined temperature, and a pair of SUS plates 14 that is disposed on both sides of the laminated structure is pressed inward from both sides. Then, the low-elasticity cushion member 13 is buried in the base deforming window 10 and presses the wiring substrate 8. The pressed wiring substrate 8 is bent toward the guide substrate 1, and the wiring lines 7 disposed in the bent portion come into pressure contact with the inside of the cut portion 2A or 2B, that is, the dummy electrode terminal patterns 4 disposed inside the section 1A or 1B. In this case, the heating temperature is determined by the material forming the base of the wiring substrate, and may be in the range of 150 to 330° C. Similarly, pressure after heating may be in the range of 1 to 4 MPa. In addition, a vacuum laminator or a vacuum press is given as an example of the heating means. The degree of vacuum is equal to or less than $1.33 \times 10^2$ Pa (1.0 torr) and preferably equal to or less than 26.7 Pa (0.2 torr).

Figure 5:
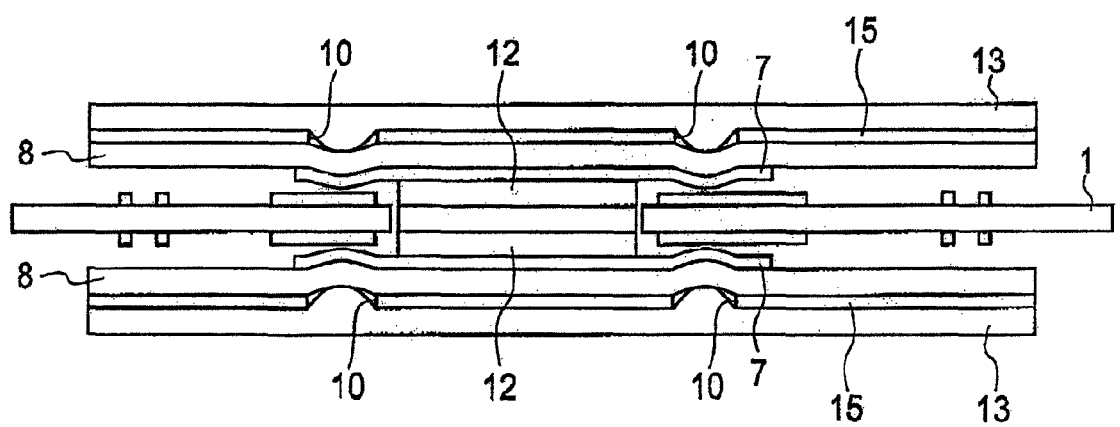
FIG. 5 is a cross-sectional view illustrating a state after a predetermined region of a wiring substrate is pressed.

FIG. 5 is a cross-sectional view illustrating a state in which the wiring substrates 8 are bent and the wiring lines 7 are brought into pressure contact with the dummy electrode terminal patterns 4 of the guide substrate, and corresponds to FIG. 4B (in FIG. 5, the SUS plate 14 is removed). In the invention, the plate-shaped low-elasticity base means a plate-shaped base with an elastic modulus smaller than that of the base of the wiring substrate.

The cushion member (plate-shaped low-elasticity base) may be made of a material with an elastic modulus smaller than that of the base of the wiring substrate. For example, the cushion member may be made of a combination of PE: Sekisui Chemical polyethylene sheet (thickness: 100 μm) and PP: Toray Trefin (thickness: 60 μm). It is possible to adjust the connection strength according to a combination of materials used in the cushion member. In FIG. 4B, the SUS plate 14 with a thickness of 2.0 mm is arranged on the outermost side.

It is preferable that the thickness of the cushion member be more than that of the wiring substrate. As described above, the cushion member is pressed and deformed to bend the wiring substrate toward the dummy electrode wiring line pattern of the guide substrate. Therefore, when the thickness of the cushion member is not equal to or more than that of the wiring substrate, it is difficult to sufficiently press the wiring substrate. Specifically, when the wiring substrate 8 is BIAC-C and the thickness of the base is 125 μm, the thickness of the cushion member is preferably in the range of the 125 to 375 μm and more preferably in the range of 160 to 320 μm in terms of a combination of materials used in the cushion member.

Figure 6A:
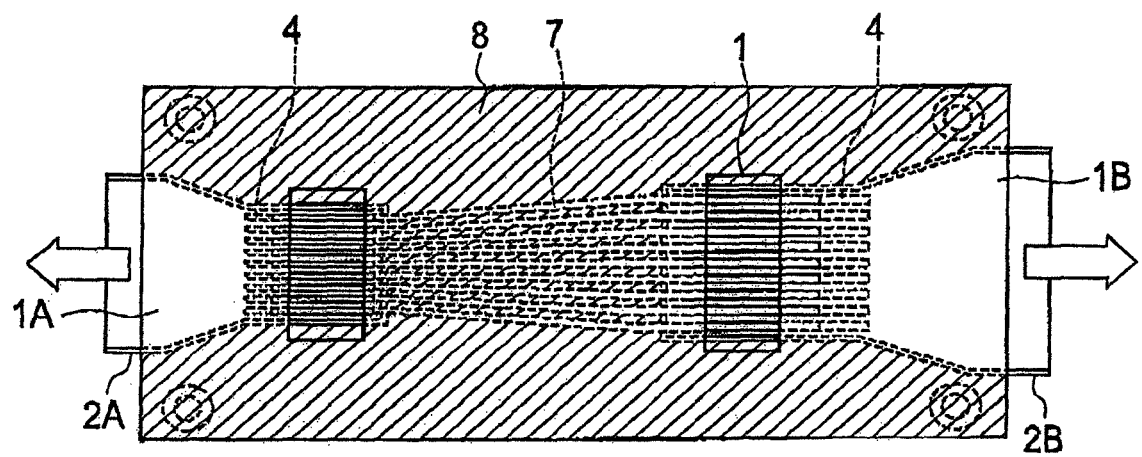
FIG. 6A is a diagram illustrating the method of manufacturing the concave connector substrate according to the invention and is a top view illustrating a state before cut portions are removed.
Figure 6B:
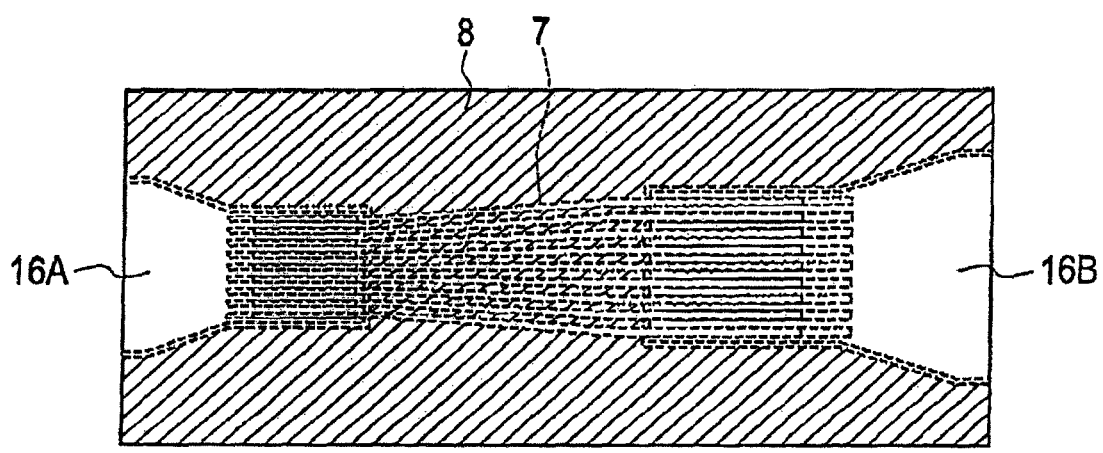
FIG. 6B is a diagram illustrating the method of manufacturing the concave connector substrate according to the invention and is a top view illustrating a state after the cut portions are removed.

After predetermined outline processing is performed, the section of the guide substrate is removed to complete a concave connector substrate with a concave structure. FIGS. 6A and 6B are diagrams illustrating the process. FIG. 6A shows the guide substrate before the sections 1A and 1B are removed, and FIG. 6(b) shows the guide substrate after the sections 1A and 1B are removed. In FIG. 6(b), white regions represented by reference numerals 16A and 16B are the guide/holding regions. A portion of the wiring line 7 is bent in the guide/holding region. When the plate-shaped connectors are inserted into the guide/holding regions 16A and 16B and reach the connection position, the connection terminals of the plate-shaped connectors come into pressure contact with the guide/holding regions and are electrically connected thereto. That is, the wiring lines disposed in the portion bent toward the guide/holding region become the connector terminals.

After lamination, the laminate is cooled to a sufficient temperature to handle the laminate using a protective device, for example, between a room temperature of about (25° C.) to 80° C. under atmospheric pressure. Then, the cushion members or the SUS plates are removed from the press structure, and a portion of the laminate represented by reference numeral 11 in FIG. 3 is cut by a router. Then, this portion of the guide substrate and the portion having the cut portion formed therein are drawn in the directions of arrows. In this case, it is preferable that the temperature be close to the room temperature. In this way, the structure wiring substrate 8 is deformed in the base deforming window 10 is obtained. When the plate-shaped connector is inserted, the wiring lines 7 of the wiring substrate 8 come into contact with the connection terminals of the plate-shaped connector at appropriate pressure.

Figure 7A:
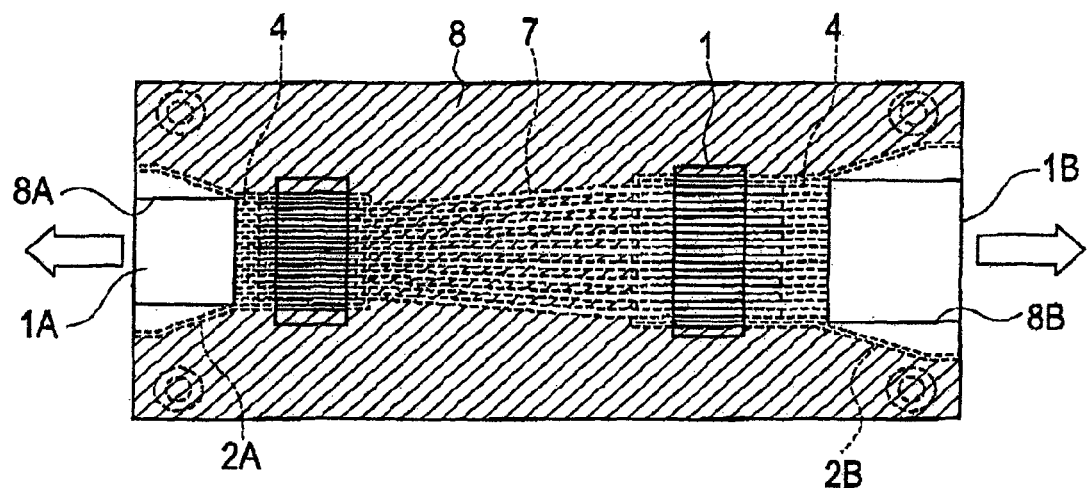
FIG. 7A is a diagram illustrating the method of manufacturing the concave connector substrate according to the invention and is a top view illustrating a state before the cut portions are removed.
Figure 7B:
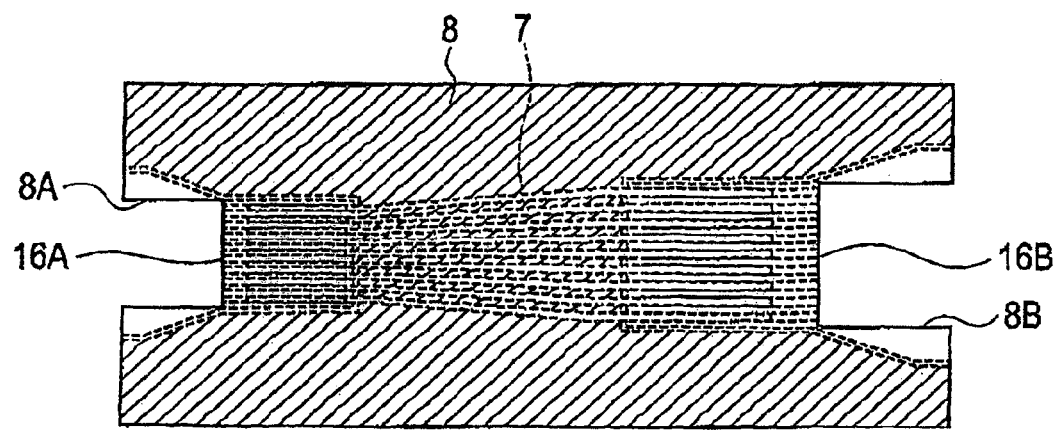
FIG. 7B is a diagram illustrating the method of manufacturing the concave connector substrate according to the invention and is a top view illustrating a state after the cut portions are removed.

In order to easily remove the sections of the guide substrate, as shown in FIG. 6A, the guide substrate 1 may be cut such that portions of the sections 1A and 1B of the guide substrate 1 protrude from the wiring substrate 8, and both ends of the guide substrate 1 may protrude from the wiring substrate 8. Alternatively, as shown in FIG. 7A, defective portions 8A and 8B may be provided in the wiring substrate 8 such that the sections 1A and 1B are exposed. The defective portions 8A and 8B of the wiring substrate 8 are cut and formed in advance so as to include lines represented by reference numerals 8A and 8B in FIGS. 7A and 7B with respect to the two wiring substrates 8 provided on both surfaces of the guide substrate 1. The shape and position of the defective portions 8A and 8B shown in FIGS. 7A and 7B are just an illustrative example, and the defective portions 8A and 8B may have any shape and may be disposed at any position as long as they can facilitate the removal of the sections of the guide substrate. The position of the defective portions 8A and 8B may be set such that the sensor substrate can be easily inserted.

According to the above-mentioned structure, it is possible to pick the edge of the guide substrate 1 in the protruding portion or the defective portion, that is, the sections 1A and 1B and it is easy to remove the sections.

As such, it is possible to provide the protruding portion by cutting the guide substrate and the wiring substrates such that a portion of the section of the guide substrate protrudes from the wiring substrate, and it is possible to easily remove the section by pick the protruding portion when the section is removed. In this way, it is possible to allocate the guide substrate and the wiring substrates to one substrate without corresponding to each of the guide substrate and the wiring substrates. That is, it is possible to achieve arrangement designs of a plurality of connectors so that it is possible to manufacture a plurality of connectors using one laminating process. When the defective portions are provided at the positions shown in FIGS. 7A and 7B, it is also possible to achieve arrangement design and manufacture of plurality of connectors. As such, when a plurality of connectors is allocated to one substrate, the positioning guide pattern does not need to be arranged for each connector. That is, as described above, the positioning guide patterns may be provided at four corners of one large substrate.

As described above, the concave connector substrate according to the invention is manufactured using the guide substrate according to the invention. As described above, it is preferable that the thickness of the guide substrate be set in consideration of the thickness of the plate-shaped connector that is used. When a portion that is thicker than the connection terminal portion exists in the plate-shaped connector and the portion is also inserted into the guide/holding region, for example, when a protective film (coverlay) is formed on the portion other than the connection terminal portion or when a semiconductor chip or a resistive element is mounted, it is preferable that the thickness of the guide substrate be equal to that of a portion in which the protective film is provided. However, as described with reference to FIGS. 7A and 7B, when the defective portions are provided in the wiring substrate in order to facilitate the removal of the sections of the guide substrate, the plate-shaped connector to be inserted is not affected by the wiring substrate in the defective portions of the wiring substrate, and the thickness thereof is not limited. Therefore, in this case, the thickness of the guide substrate, not the thickness of the portion in which the protective film is provided, may be equal to that of the connection terminal portion of the plate-shaped connector.

For example, TPX: Mitsui Chemicals, Inc. X-44B (thickness: 50 μm) is used as a candidate material of a mold release material that is used in a method of manufacturing the guide substrate, the concave connector substrate, or the concave connector substrate. For example, PE: Sekisui Chemical polyethylene sheet (thickness: 100 μm) or PP: Toray Trefin (thickness: 60 μm) is used as a candidate material of the cushion member.

Next, a first aspect of a method of manufacturing a concave connector substrate according to the invention will be described. In the following description, the concave connectors are provided at both ends of the concave connector substrate. In the first aspect, the concave connector is provided at one end of the concave connector substrate, and a through hole connection portion is provided at the other end thereof.

Next, the first aspect will be described with reference to FIGS. 9 to 12. In FIGS. 9 to 12, substantially the same components as those in FIGS. 1 to 8 are denoted by the same reference numerals.

Figure 9:
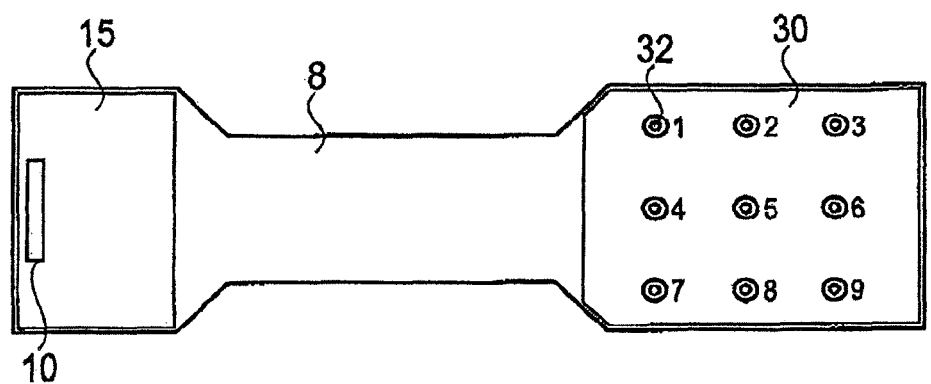
FIG. 9 is a top view illustrating the concave connector substrate that is manufactured by a first aspect of a manufacturing method according to the invention.

FIG. 9 is a top view illustrating the completion of the concave connector substrate according to the first aspect of the invention. The concave connector substrate shown in FIG. 9 has the concave connector at one end (the left side of FIG. 9) and a through hole connection region 30 including nine through hole connection portions 32 at the other end (the right side of FIG. 9). On the concave connector side, the metal layer 15 formed on the wiring substrate 8 is exposed to the outside, and the base deforming window 10 is formed in the metal layer 15. in the through hole connection region 30, a total of nine through hole connection portions 32 are arranged as shown in FIG. 9.

Figure 10:
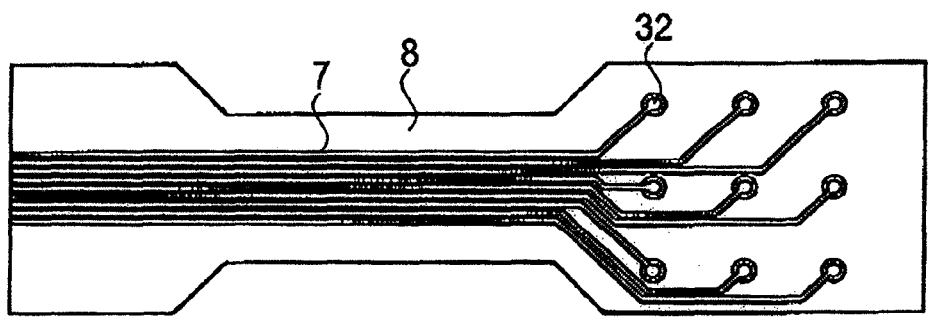
FIG. 10 is a diagram illustrating the rear surface of a wiring substrate in the concave connector substrate shown in FIG. 9.

FIG. 10 is a diagram illustrating the rear surface (a surface opposite to the front surface shown in FIG. 9) of the wiring substrate 8. As shown in FIG. 10, nine wiring lines 7 of the wiring substrate 8 extend from the connector terminals of the concave connector to the through hole connection portions 32 of the through hole connection region.

Figure 11:
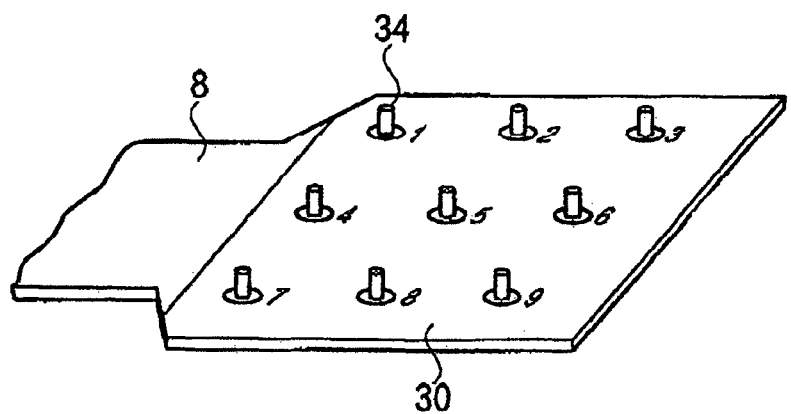
FIG. 11 is a perspective view illustrating the arrangement of pins that are uprightly provided in through hole connection portions of the concave connector substrate shown in FIG. 9.

In the above-mentioned structure, during actual use, a plate-shaped connector, such as a sensor substrate, may be fitted and connected to the concave connector. Pins may be uprightly provided in the through hole connection portions of the through hole connection region and fixed thereto by soldering, and wiring lines for connecting a measuring device to the pins may be connected by crocodile clips. FIG. 11 shows a state in which pins 34 are provided in the through hole connection portion 32 and are fixed thereto by soldering. For example, a check terminal for logic, part number: ST series ST-1-1 (corresponding to a through hole with a diameter of φ 0.8), manufactured by Mac-Eight Co., Ltd., which is on the market, may be used as the pin provided in the through hole connection portion.

The through holes are not provided in the through hole connection region of the wiring substrate 8 after the guide substrate and the wiring substrates are laminated and the concave connector substrate is completed, but are provided in the wiring substrate before the lamination. Therefore, the through holes are electrically connected to only one side of the guide substrate, but are not electrically connected to the wiring lines of the wiring substrate that is disposed on the opposite side. Therefore, the wiring lines may extend to only one surface, or both surfaces.

It is preferable that a base nickel film or a base gold film be formed on the surfaces of the wiring lines 7 and the through hole region 30 by electrolytic plating before lamination.

In the concave connector substrate, when the plate-shaped connector is fitted and connected to the concave connector, it is necessary to check the direction of the connector terminal to be electrically connected to the pin that is used, that is, the insertion surface of the plate-shaped connector. When the pins with an appropriate length are inserted into the through holes and through hole electrodes that extend to both outer sides and are fixed, it is possible to perform double-sided access in the through hole connection region. That is, in this case, the side of the through hole to which the pin is soldered can be accessed, and it is possible to check the connection side according to whether soldering is performed. When soldering is performed on both surfaces of the through hole connection region, the plate-shaped connector is used, paying attention to the symmetry of the plate-shaped connector with respect to the vertical direction. In this case, any side of the plate-shaped connector may be used to connect the through hole connection region.

Figure 12:
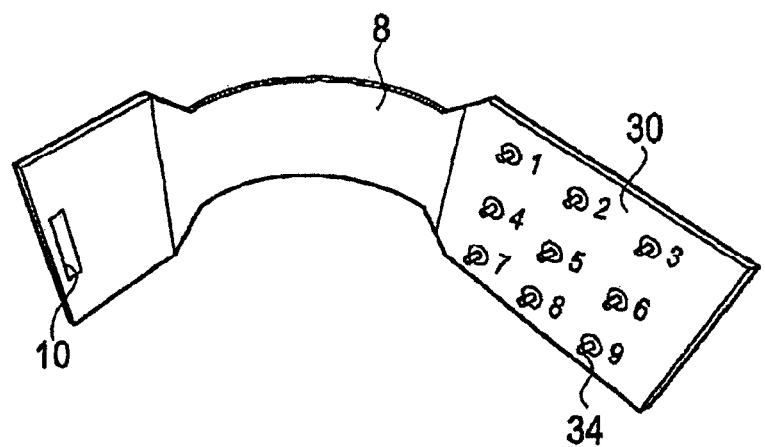
FIG. 12 is a perspective view illustrating the bent state of the concave connector substrate shown in FIG. 9.

Since the concave connector substrate according to the invention is made of the above-mentioned material, it can be bent. Specifically, the concave connector substrate can be bent and used, as shown in FIG. 12. Even though the concave connector substrate is bent at a curvature radius of 10 mm, it is not broken. The bending of the concave connector substrate will be described in detail below.

Figure 13:
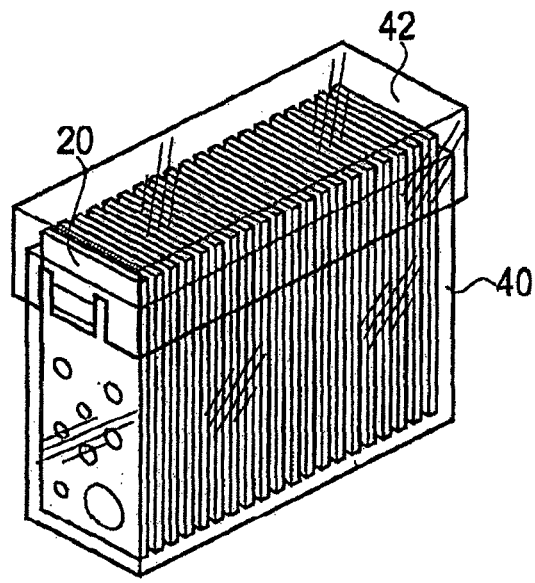
FIG. 13 is a perspective view illustrating sensor substrates accommodated in a case.

FIG. 13 is a diagram illustrating an example of a case that accommodates the sensor substrate (plate-shaped connector) used in the concave connector substrate according to the invention. FIG. 13 shows the storage of a plurality of sensor substrates 20 in a case 40 with a cover 42. In FIG. 13, the sensor substrates 20 are accommodated such that terminal portions face the cover 42. In the related art, when the sensor substrate is used, tweezers are used to pick up the sensor substrate and take out it from the case, and the sensor substrate is connected to an openable connector. However, in the invention, the sensor substrate 20 is not taken out from the case 40, but the concave connector unit of the concave connector substrate is allocated to the terminal portion of the contained sensor substrate 20 with the cover 42 of the case 40 opened. Then, the concave connector unit is fitted to the terminal portion to take out the sensor substrate. In this way, it is possible to take out the sensor substrate from the case 40 while being connected (fitted) to the concave connector substrate. Therefore, it is possible to perform the extraction of sensor substrate from the case and the connection of the sensor substrate to the concave connector substrate at the same time, without using the tweezers. As a result, this structure is efficient. In addition, after the sensor substrate connected to the concave connector substrate is used to perform a sensing operation, it is possible to treat the sensor substrate to which a test solution (for example, a blood serum or a toxic agent) that should not be directly touched by the hands, without using, for example, tweezers. Therefore, it is possible to ensure high safety and prevent the contamination of tweezers. In addition, since the measured sensor substrate can be arranged and stored, it is possible to improve the convenience of both the concave connector substrate and the case.

Next, a second aspect of the concave connector substrate according to the invention will be described. The second aspect is a structure for improving the connection strength between a concave connector unit of the concave connector substrate and the plate-shaped connector.

The connection strength of the concave connector unit depends on the pattern shape of the base deforming window (window) 10 shown in FIG. 5 and the conductor pattern of the guide substrate at a position corresponding to the pattern shape, in addition to a cushion structure or the pressure of the process during a process of pressing the wiring substrate. In a process of forming the guide/holding region, when the section disposed inside the cut portion of the guide substrate is removed, frictional force determines connection strength. When the section of the guide substrate is set such that the thickness thereof is less than the maximum thickness of the plate-shaped connector in at least the base deforming window, it is possible to improve the connection strength.

As described above, when the wiring substrate 8 in the base deforming window 10 is pressed and bent, the wiring lines 7 of the wiring substrate 8 come into pressure contact with the dummy electrode terminal patterns provided in the section of the guide substrate 1. In this case, when the section of the guide substrate 1 is set such that the thickness thereof is less than the maximum thickness of the plate-shaped connector to be inserted or removed in at least the base deforming window 10, this state is maintained after the section is removed. When a plate-shaped connector thicker than the section is inserted, the plate-shaped connector is strongly interposed between the bent wiring substrates, and it is possible to improve the connection strength. That is, in this way, when the plate-shaped connector is inserted with the wiring substrate being bent, the bent portion of the wiring substrate is displaced toward the center of the plate-shaped connector in the thickness direction. The wiring substrate urges the plate-shaped connector in the pressure direction in the bent portion, and the force of the wiring substrate to hold the electrode terminal pattern increases. Therefore, when the plate-shaped connector is inserted or removed, the frictional force increases. As a result, the connection strength increases.

When the section of the guide substrate is set such that the thickness thereof is less than the maximum thickness of the plate-shaped connector to be inserted or removed, for example, it is considered that a portion of or the entire dummy electrode terminal pattern provided in the section of the guide substrate is removed or the thickness of at least the section is less than that of the plate-shaped connector which is actually used.

Figure 14:
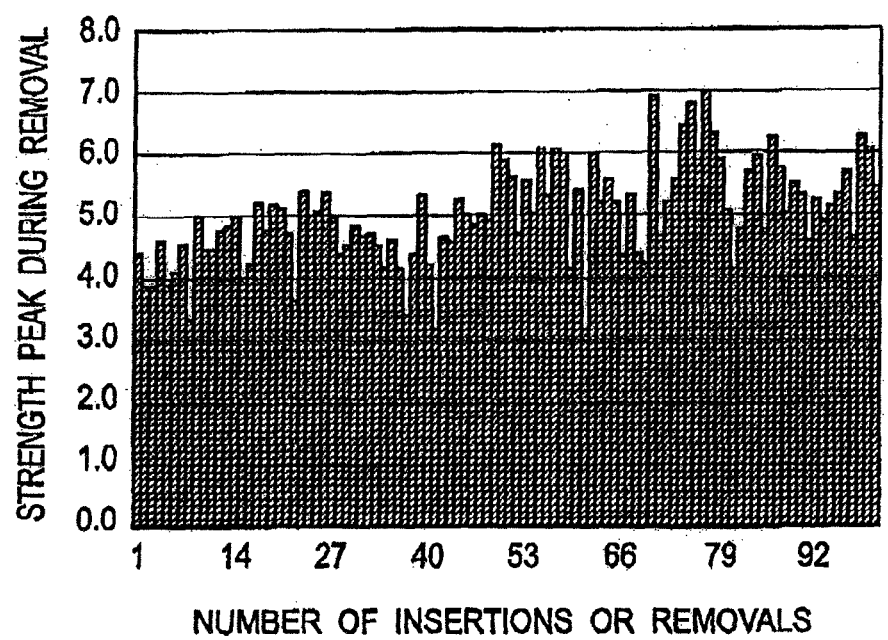
FIG. 14 is a graph illustrating the insertion or removal force of a concave connector unit of the concave connector substrate that is manufactured by a second aspect of the manufacturing method according to the invention.

As in the above-mentioned structure, actually, the dummy electrode terminal pattern was not provided in the section of the guide substrate, and a concave connector substrate having connector terminals obtained by pressing and bending the wiring substrate in the substrate deforming window was manufactured. Then, the insertion and removal force was checked. The check result provided that a minimum force of 3.0 N was ensured and the substrate could be repeatedly used a minimum of 100 times, as shown in FIG. 14.

<Concave Connector Substrate>

Next, a concave connector substrate according to the invention will be described.

A first aspect of a concave connector substrate according to the invention is manufactured by the above-mentioned manufacturing method according to the invention and has flexibility. The concave connector substrate is formed such that the width thereof at both ends in the direction in which the wiring lines extend is more than that at the center in the direction in which the wiring lines extend.

Figure 15A:
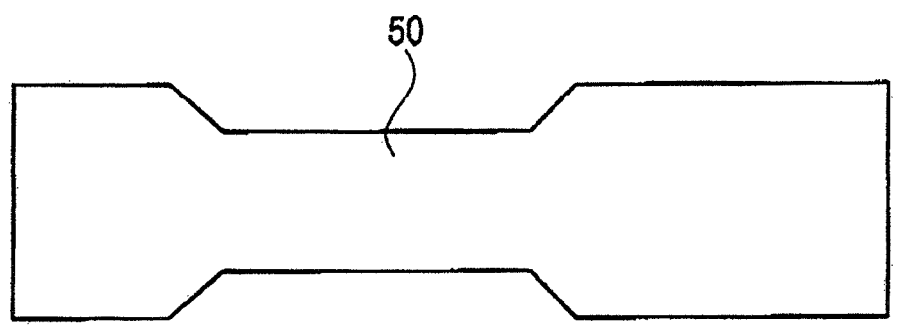
FIG. 15A is a top view illustrating another aspect of the concave connector substrate according to the invention.
Figure 15B:
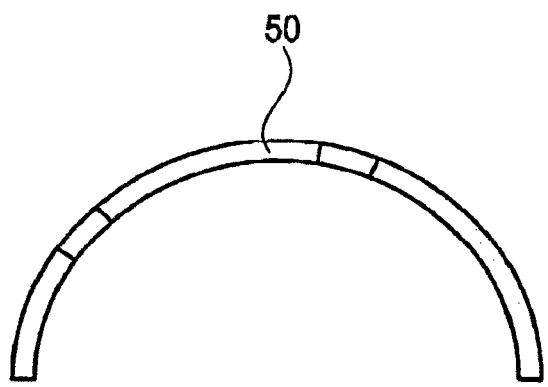
FIG. 15B is a side view illustrating the bent state of the concave connector substrate shown in FIG. 15A.

FIG. 15A is a top view illustrating an example of a concave connector substrate 50 according to the first aspect of the invention and corresponds to FIG. 9. In FIG. 15A, the substrate deforming window 10 or the through hole connection portion is not shown, and only the outline of the concave connector substrate is shown. Actually, the concave connector is provided on one of the left and right sides of the concave connector substrate, and the wiring lines are provided in the concave connector substrate in the longitudinal direction (the left-right direction of FIG. 15A). The concave connector substrate 50 is formed such that the width thereof at both ends (left and right ends of FIG. 15A) in the direction in which the wiring lines extend is more than that at the center in the direction in which the wiring lines extend. In this way, the bending stress of the concave connector substrate is reduced and the concave connector substrate can be easily bent, as compared to the concave connector substrate that has a constant width from one end to the other end. FIG. 15B is a side view illustrating the bent state of the concave connector substrate shown in FIG. 15A. As such, the concave connector substrate can be bent. Therefore, when a sensor substrate is inserted into the concave connector and the sensor substrate is immersed in, for example, a container or a cylinder having a test solution therein for measurement, it is possible to ensure safety. That is, for example, when the through hole connection portion is provided at the other end of the concave connector substrate and is fastened by the crocodile clips of a measuring device, the entire connector becomes unstable.

However, when the concave connector substrate is bent, it is possible to fix the other end to a flat surface and stabilize the connector. The degree of bending is not limited to that shown in FIG. 15B, but the concave connector substrate can be bent as long as the bending strength of the concave connector substrate is allowed.

Next, a second aspect of the concave connector substrate according to the invention will be described. The concave connector substrate according to the second aspect is manufactured by the above-mentioned manufacturing method according to the invention and has flexibility. In the concave connector substrate, when the concave connector substrate is bent at the center in the direction in which the wiring lines extend, cut portions forming non-compliant regions that do not follow the bending are provided on both sides of the concave connector substrate in the width direction orthogonal to the direction in which the wiring lines extend. The cut portions are set to a size that allows one end of the concave connector substrate to be engaged with the non-compliant regions when the concave connector substrate is bent in a substantially U shape. The concave connector substrate includes a locking means that engages the non-compliant regions with one end of the concave connector substrate to lock the non-compliant regions at the engagement position.

The 'non-compliant region that does not follow bending' means a region that does not follow bending when both ends of the concave connector substrate are bent.

Figure 16A:
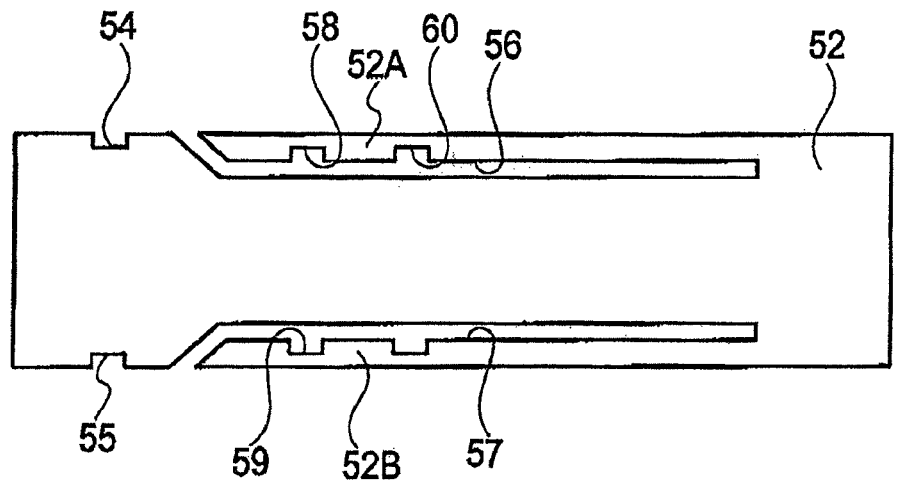
FIG. 16A is a top view illustrating still another aspect of the concave connector substrate according to the invention.
Figure 16B:
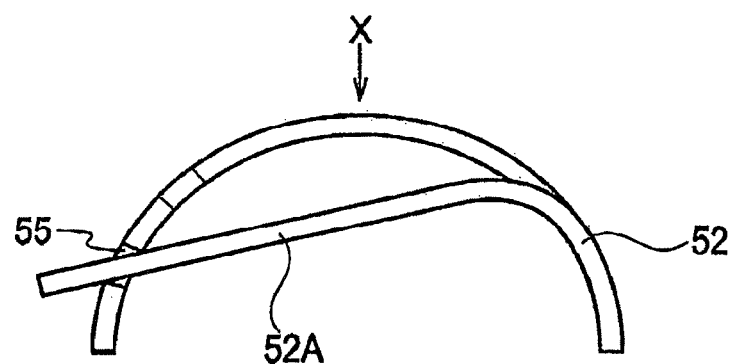
FIG. 16B is a side view illustrating the bent and locked state of the concave connector substrate shown in FIG. 16A.
Figure 16C:
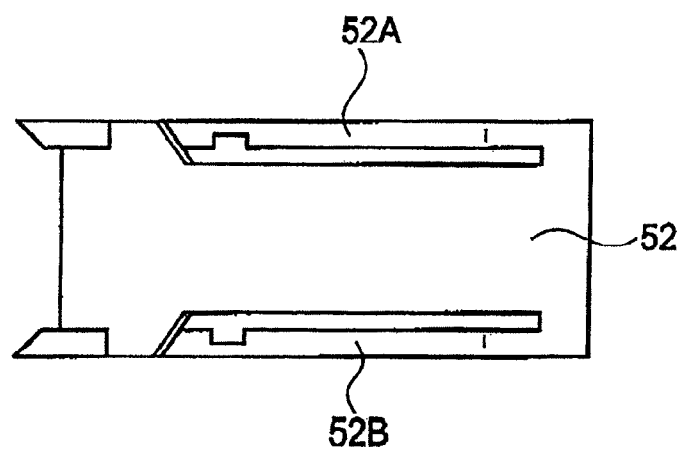
FIG. 16C is a top view illustrating the state shown in FIG. 16B as viewed from the direction of an arrow X.

FIGS. 16A to 16C show an example of the concave connector substrate according to the second aspect. FIG. 16A is a top view, FIG. 16B is a side view illustrating the state of the concave connector substrate shown in FIG. 16A that is bent and locked in a substantially U shape, and FIG. 16C is a diagram illustrating the state shown in FIG. 16B, as viewed from the upper side (the direction of an arrow X in FIG. 16B). In a concave connector substrate 52 shown in FIGS. 16A to 16C, similar to FIG. 15A, only the outline of the concave connector substrate is shown. However, the concave connector is formed at one of the left and right ends of the concave connector substrate, and the wiring lines are provided in the concave connector substrate in the longitudinal direction (the left-right direction of FIG. 16A).

The concave connector substrate 52 has cut portions 56 and 57 that are formed at both sides in the width direction orthogonal to the direction in which the wiring lines extend along the direction in which the wiring lines extend with a mirror image relationship therebetween. The cut portions 56 and 57 extend in the direction in which the wiring lines extend, and non-compliant regions 52A and 52B that do not follow bending when the concave connector substrate 52 is bent at the center in the direction in which the wiring lines extend are formed outside the cut portions. Since most of the non-compliant regions 52A and 52B are separated from the concave connector body 52, the non-compliant regions 52A and 52B do not follow bending when the concave connector substrate 52 is bent at the center in the direction in which the wiring lines extend. Therefore, the non-compliant regions 52A and 52B can be independently operated when the concave connector substrate is bent in a substantially U shape. In addition, the cut portions 56 and 57 are set to a size that allows the non-compliant regions 52A and 52B to be engaged with one end (the left end of FIG. 16A) of the concave connector substrate 52 when the concave connector substrate 52 is bent in a substantially U shape.

The amount of bending of the concave connector substrate depends on, for example, a cross-sectional structure including purposes, a material forming the concave connector substrate, the thickness thereof, and the number of wiring lines. Therefore, it is preferable that the size of the non-compliant region be set in consideration of the amount of bending such that the non-compliant regions are engaged with one end of the concave connector substrate with a desired amount of bending. For example, the length of the non-compliant region may be equal to or less than half the length of the concave connector substrate 52 in the direction in which the wiring lines extend.

In the concave connector substrate 52, cutouts (locking means) 54 and 55 and cutouts 58 and 59 are formed at one end of the concave connector substrate 52 and in the non-compliant regions 52A and 52B. When the non-compliant regions 52A and 52B are engaged with one end of the concave connector substrate 52, the cutouts 54 and 55 and the cutouts 58 and 59 are for locking the non-compliant regions 52A and 52B at the engagement position. As shown in FIGS. 16B and 16C, when the concave connector substrate 52 is bent in a substantially U shape, it is possible to maintain the bent state of the concave connector substrate 52 by hooking and locking the cutouts of the non-compliant regions 52A and 52B to the cutouts of the concave connector substrate 52.

Two cutouts are formed in each of the non-compliant regions 52A and 52B, and it is possible to maintain the bent state at different bending angles by changing each of the cutouts.

Figure 17A:
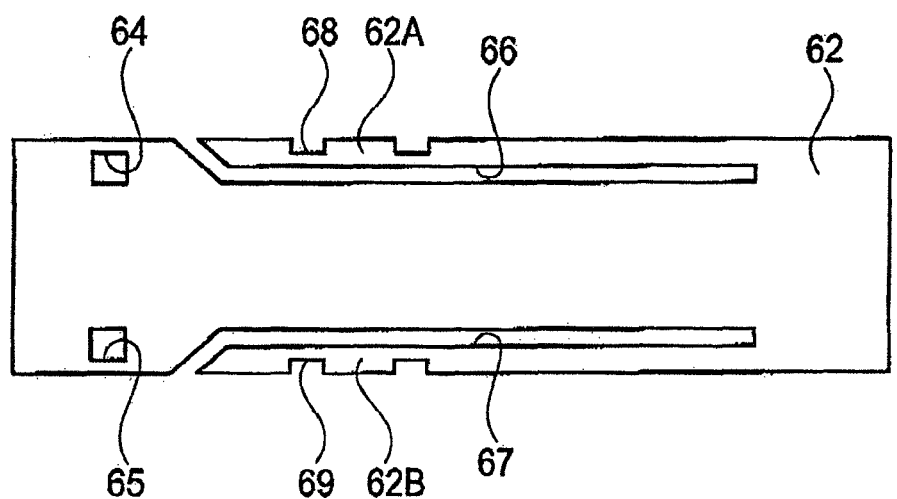
FIG. 17A is a top view illustrating a modification of the concave connector substrate shown in FIG. 16.
Figure 17B:
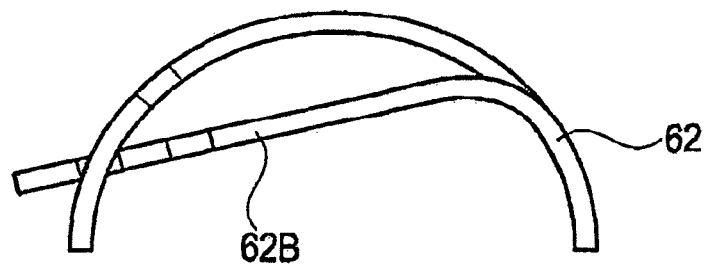
FIG. 17B is a side view illustrating the bent and locked state of the concave connector substrate shown in FIG. 17A.

When the non-compliant regions are engaged with one end of the concave connector substrate, as the locking means that locks the non-compliant regions at the engagement position, the following structure may be used in addition to the cutouts shown in FIG. 16A: a locking structure in which the non-compliant region is cut out to form a protruding portion and an engaging hole that can be engaged with the protruding portion is formed in the concave connector substrate. FIGS. 17A and 17B show an example of the concave connector substrate having the above-mentioned structure. FIG. 17A is a top view, and FIG. 17B is a side view illustrating the bent and locked state of the concave connector substrate shown in FIG. 17A in a substantially U shape. In a concave connector substrate 62 shown in FIGS. 17A and 17B, similar to FIGS. 15 and 16, only the outline of the concave connector substrate is shown. However, the concave connector is formed at one of the left and right ends of the concave connector substrate, and the wiring lines are provided in the concave connector substrate in the longitudinal direction (the left-right direction of FIG. 17A).

The concave connector substrate 62 has cut portions 66 and 67 that are formed at both sides in the width direction orthogonal to the direction in which the wiring lines extend along the direction in which the wiring lines extend with a mirror image relationship therebetween. The cut portions 66 and 67 extend in the direction in which the wiring lines extend, and non-compliant regions 62A and 62B that do not follow bending when the concave connector substrate 62 is bent at the center in the direction in which the wiring lines extend are formed outside the cut portions. Since most of the non-compliant regions 62A and 62B are separated from the concave connector body 62, the non-compliant regions 62A and 62B do not follow bending when the concave connector substrate 62 is bent at the center in the direction in which the wiring lines extend. Therefore, the non-compliant regions 62A and 62B can be independently operated when the concave connector substrate is bent in a substantially U shape. In addition, the cut portions 66 and 67 are set to a size that allows the non-compliant regions 62A and 62B to be engaged with one end (the left end of FIG. 17A) of the concave connector substrate 62 when the concave connector substrate 62 is bent in a substantially U shape.

In the concave connector substrate 62, engaging holes (locking means) 64 and 65 are formed at one end of the concave connector substrate 62, and cutouts 68 and 69 are formed in the non-compliant regions 62A and 62B. When the non-compliant regions 62A and 62B are engaged with one end of the concave connector substrate 62, the engaging holes 64 and 65 and the cutouts 68 and 69 are for locking the non-compliant regions 62A and 62B at the engagement position. As shown in FIG. 17B, when the concave connector substrate 62 is bent in a substantially U shape, it is possible to maintain the bent state of the concave connector substrate 62 by inserting the non-compliant regions 62A and 62B into the engaging holes 64 and 65 and hooking and locking the cutouts 68 and 69 of the non-compliant regions 62A and 62B to the engaging holes of the concave connector substrate 62.

Two cutouts are formed in each of the non-compliant regions 62A and 62B, and it is possible to maintain the bent state at different bending angles by changing each of the cutouts.

Figure 18A:
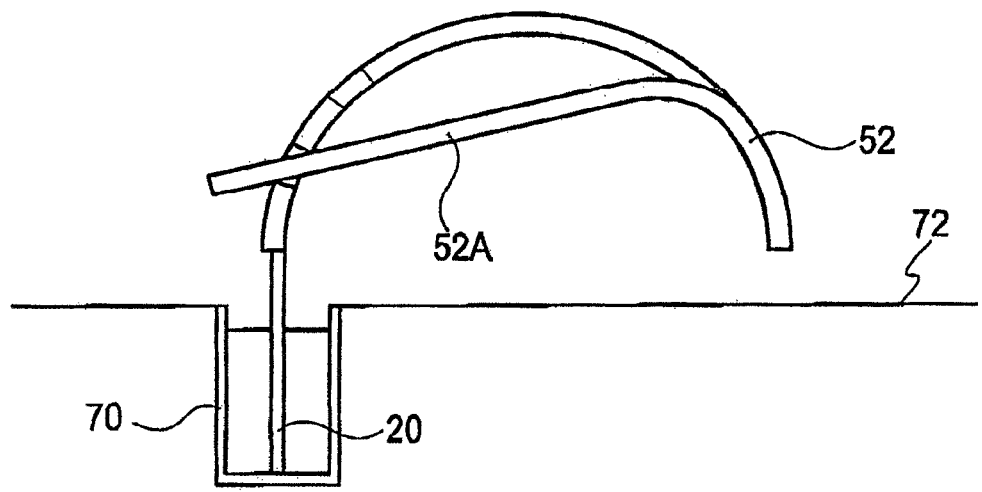
FIG. 18A is a schematic diagram illustrating a state in which the concave connector substrate shown in FIG. 16 is bent and locked and is connected to the sensor substrate in the bent and locked state to measure a sample in a cylinder.
Figure 18B:
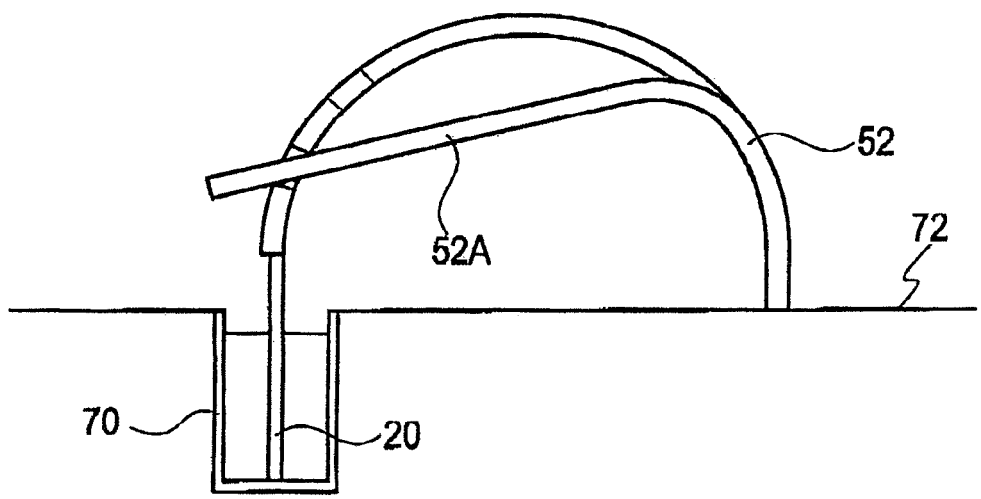
FIG. 18B is a diagram illustrating the concave connector substrate FIG. 18A with one end coming into contact with a mounting surface.

When the sensor substrate 20 shown in FIG. 8 is connected to the concave connector substrate according to the second aspect and is used to measure a sample in the cylinder, it is preferable that the length of the cut portion be appropriately set in consideration of the length of the connected sensor substrate and the positional relationship between a mounting surface on which the bent concave connector substrate is placed and the bottom of the cylinder such that the bent concave connector substrate to which the sensor substrate is connected is maintained at the measurement position. FIGS. 18A and 18B are schematic diagrams illustrating a state in which the concave connector substrate 52 shown in FIGS. 17A and 17B is bent and locked and the sensor substrate 20 is connected to one end of the sensor substrate in the bent and locked state to measure a sample in a cylinder 70. In FIGS. 18A and 18B, the cylinder 70 is provided below a mounting surface G on which the concave connector substrate 52 is placed, and a sample to be measured is put into the cylinder 70. In this state, when the concave connector substrate 52 and the sensor substrate 20 are used to measure the sample in the cylinder 70 and the leading end of the sensor substrate 20 comes into contact with the bottom of the cylinder 70, the other end of the concave connector substrate 52 floats from the mounting surface G. As a result, the concave connector substrate becomes unstable (FIG. 18A). Therefore, the length of the cut portion of the concave connector substrate is appropriately adjusted such that the leading end of the sensor substrate comes into contact with the bottom of the cylinder and the other end of the concave connector substrate comes into contact with the mounting surface G. In this way, it is possible to stabilize the concave connector substrate (FIG. 18B).

Figure 19:
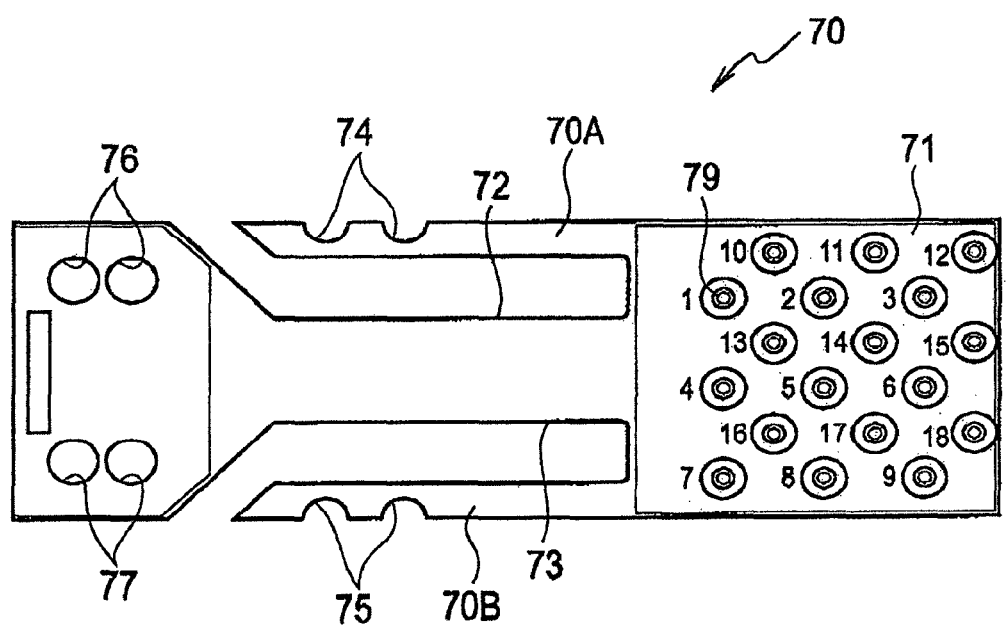
FIG. 19 is a top view illustrating another aspect of the concave connector substrate according to the invention.
Figure 20:
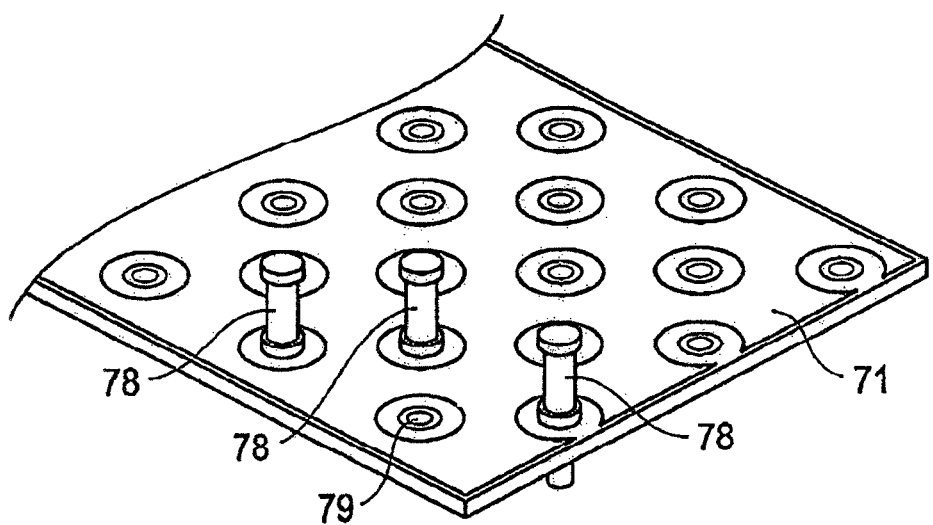
FIG. 20 is a perspective view illustrating only a through hole connection region of the concave connector substrate shown in FIG. 19.

Next, another example of the concave connector substrate according to the second aspect will be described. FIG. 19 is a top view illustrating a concave connector substrate 70 according to another example. In the concave connector substrate 70 shown in FIG. 19, a concave connector is formed on the left side of FIG. 19, and a through hole connection region 71 is formed on the right side of FIG. 19. Eighteen through hole connection portions 79 are provided in the through hole connection region 71. As shown in FIG. 20, eighteen pins 78 may be uprightly provided. Although not shown in the drawings, similar to the structure shown in FIG. 10, in the concave connector substrate 70, the connector terminals of the concave connector are electrically connected to through hole connection portions 79 of the through hole connection region 71 through the wiring lines.

The concave connector substrate 70 has cut portions 72 and 73 that are formed at both sides in the width direction orthogonal to the direction in which the wiring lines extend along the direction in which the wiring lines extend with a mirror image relationship therebetween. The cut portions 72 and 73 extend in the direction in which the wiring lines extend, and non-compliant regions 70A and 70B that do not follow bending when the concave connector substrate 70 is bent at the center in the direction in which the wiring lines extend are formed outside the cut portions. Similar to the non-compliant regions 52A and 52B shown in FIG. 16, the non-compliant regions 70A and 70B can be independently operated when the concave connector substrate is bent in a substantially U shape. In addition, the cut portions 72 and 73 are set to a size that allows the non-compliant regions 70A and 70B to be engaged with one end (the left end A of FIG. 19A) of the concave connector substrate 70 when the concave connector substrate 70 is bent in a substantially U shape.

Figure 21:
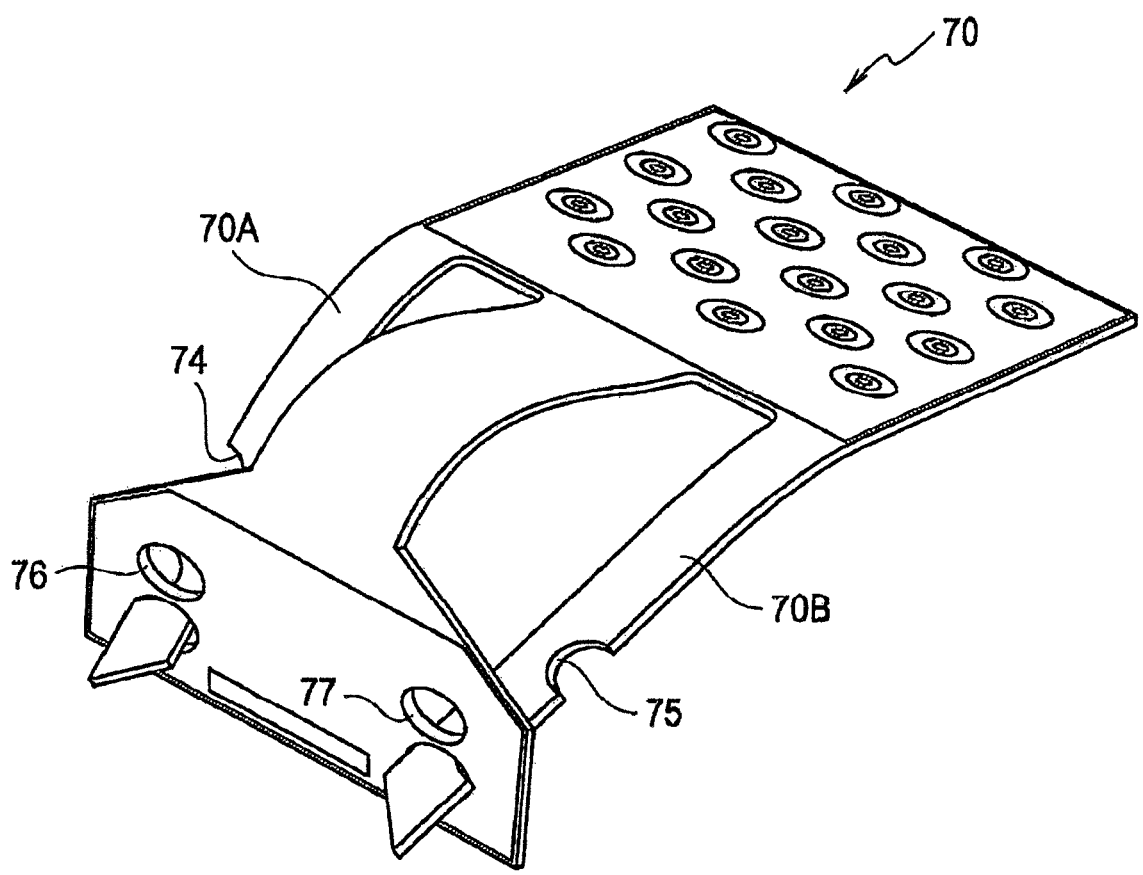
FIG. 21 is a perspective view illustrating the concave connector substrate shown in FIG. 19 that is bent and locked at an obtuse angle.
Figure 22:
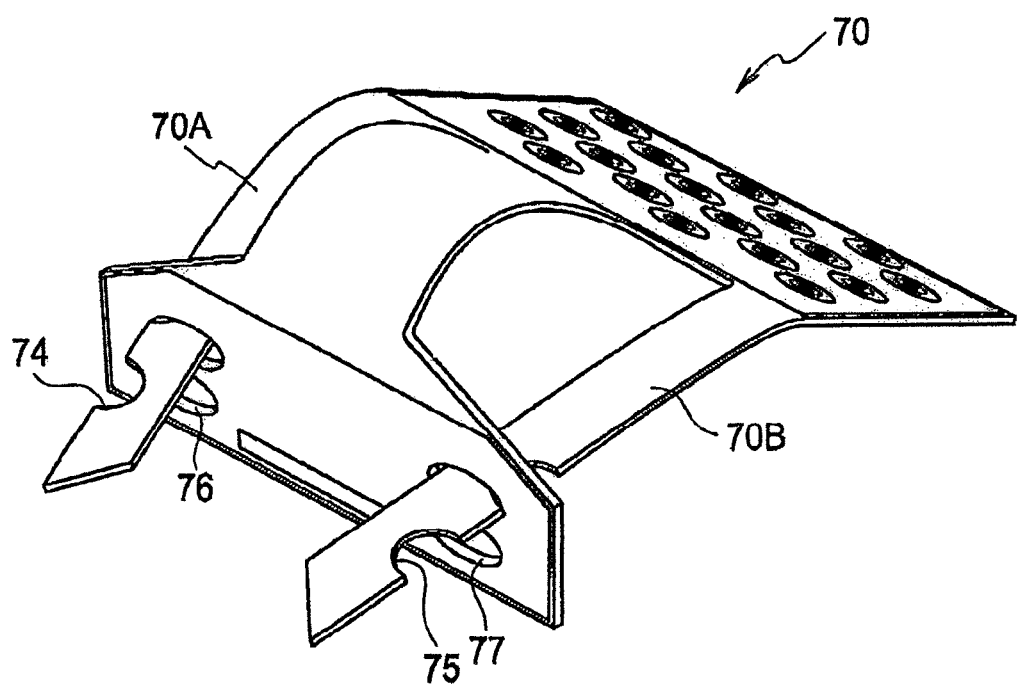
FIG. 22 is a perspective view illustrating the concave connector substrate shown in FIG. 19 that is bent and locked at an acute angle.

In the concave connector substrate 70, cutouts (locking means) 74 and 75 and circular engaging holes 76 and 77 are formed in the non-compliant regions 70A and 70B and at one end of the concave connector substrate 70. When the non-compliant regions 70A and 70B are engaged with one end of the concave connector substrate 70, the cutouts 74 and 75 and the circular engaging holes 76 and 77 are for locking the non-compliant regions 70A and 70B at the engagement position. As shown in FIGS. 21 and 22, when the concave connector substrate 70 is bent in a substantially U shape, it is possible to maintain the bent state of the concave connector substrate 70 by hooking and locking the cutouts of the non-compliant regions 70A and 70B to the engaging holes of the concave connector substrate 70.

Two cutouts and engaging holes are formed in each of the non-compliant regions 70A and 70B, and it is possible to maintain the bent state at different bending angles by changing each of the cutouts. FIG. 21 shows a case in which the cutouts 74 and 75 provided at the leading ends of the non-compliant regions 70A and 70B are engaged with the locking holes 76 and 77 provided at the leading end of the concave connector substrate 70 and the concave connector substrate 70 is bent at an obtuse angle. FIG. 22 shows a case in which the cutouts different from the above-mentioned cutouts are engaged with the locking holes different from the above-mentioned locking holes and the concave connector substrate 70 is bent at an acute angle.

It is preferable that the non-compliant regions having the cutouts or the locking holes be formed at the same time as the laminate is cut into individual connectors. In many cases, it is necessary to adjust the positions or shapes of the non-compliant regions and the engaging holes according to circumstances. Therefore, as described above, it is preferable to use a router using NC data.

As described above, according to the invention, in the system in which an electronic device, such as an electrochemical measurement substrate, a memory card, or a sensor chip, is inserted into the concave connector so as to be electrically connected thereto, the manufacture of a case using a precision mold, the mechanical processing of terminal leads, and a packaging process for them are not needed in order to accurately fit the plate-shaped connector of the electronic device to the concave connector. In addition, it is easy to reduce the manufacturing costs of the connector when responding to small quantity batch production. In addition, the flexibility of the design of the thickness or connection terminals of a substrate, a card, or a chip to be inserted is improved, and it is possible to obtain wiring lines that are obtained by integrating the connector terminals and the cables and are capable of improving connection accuracy and the flexibility of the design and reducing manufacturing costs.

In this way, it is not necessary to individually mount the connectors and the cables and it is possible to significantly reduce manufacturing costs. In addition, it is possible to continuously change connection strength by adjusting the structure of a material during lamination or the base deforming window during lamination.

<Measuring Kit>

Next, a measuring kit according to the invention will be described.

The measuring kit according to the invention is used to measure a sample using a sensor with a connector obtained by inserting a sensor substrate into the guide/holding region of the above-described concave connector substrate according to the invention. The measuring kit includes a cylinder into which the sensor substrate and a sample to be measured are introduced and a barrel-shaped case body having the cylinder provided therein. Grooves with the bottoms to which the bottoms of the cylinders are fitted are formed in the inner bottom of the case body. A cutout that holds the sensor substrate and extends from an opening portion of the cylinder to the bottom is formed in the inner wall of the cylinder.

Next, the measuring kit according to the invention will be described with reference to the drawings.

Figure 23:
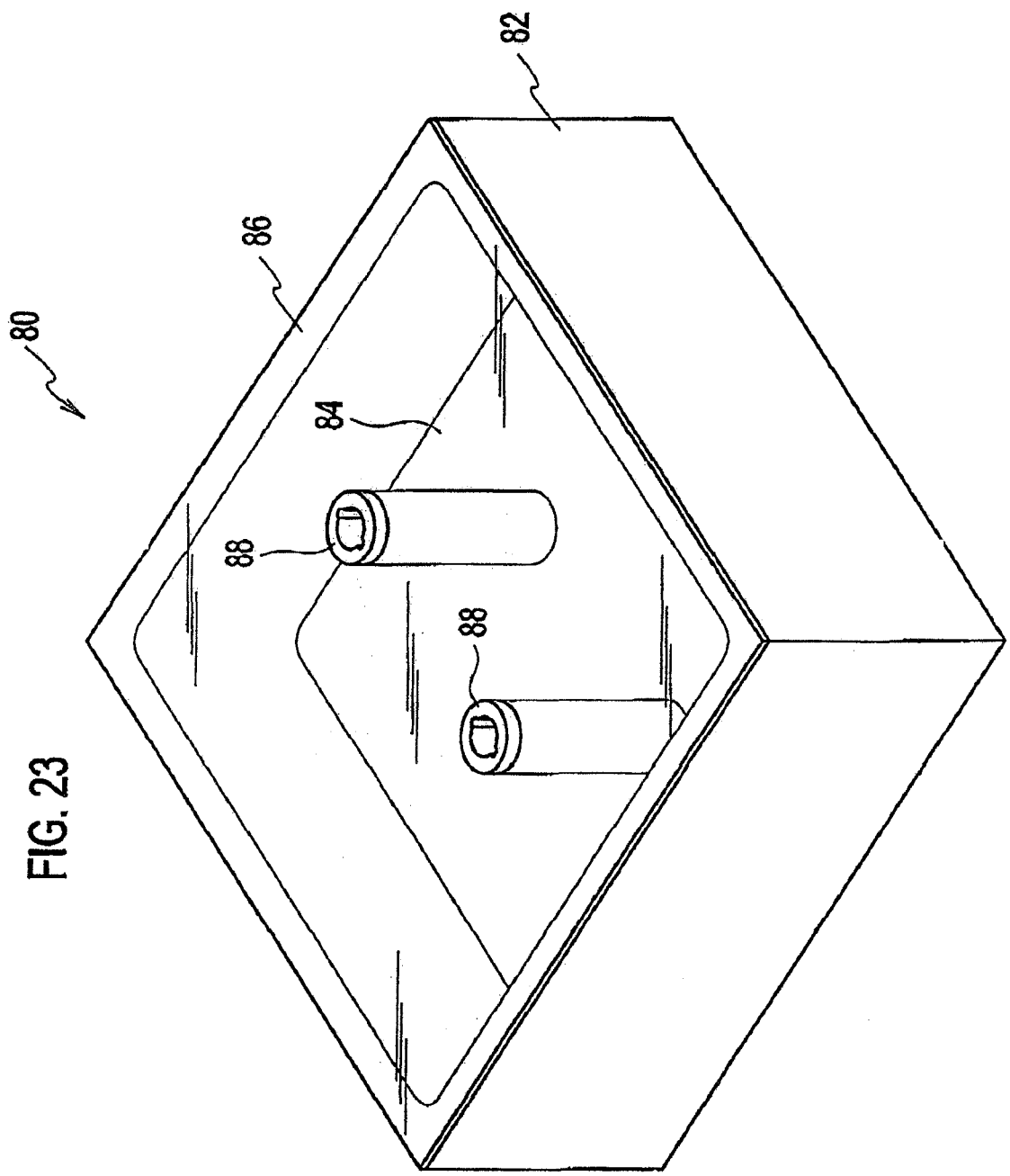
FIG. 23 is a perspective view illustrating a measuring kit according to the invention.

FIG. 23 is a perspective view illustrating an example of the measuring kit according to the invention, and FIG. 24 is a cross-sectional view illustrating the measuring kit shown in FIG. 23 taken along two cylinders. A measuring kit 80 includes a barrel-shaped case body 82 and two circular cylinders 88 that are vertically provided in the case body 82 and have a cylindrical shape with the bottom. As shown in FIG. 23, grooves with the bottom to which the bottoms of the cylinders 88 are fitted are formed in the inner bottom of the case body 82, and O-rings 90 are provided in the grooves with the bottom. The O-ring 90 is formed such that the inside diameter thereof is substantially equal to the outside diameter of the circular cylinder 88, and is made of, for example, a resin or rubber with elasticity. When the cylinder 88 is fitted to the groove with the bottom, the O-ring 90 fastens the cylinder 88, thereby strongly fixing the cylinder 88. In this way, it is possible to prevent the cylinder from being detached from the groove with the bottom.

A metal plate (plate-shaped member) 84 is provided on the inner bottom of the case body 82 so as to cover the inner bottom of the case body 82. The metal plate 84 has opening portions through which the circular cylinders 88 pass and which lock the O-rings 90. That is, the metal plate 84 has the opening portions with a shape that is substantially the same as that of the bottom of the cylinder 88. When the metal plate 84 is provided on the inner bottom of the case body 82, the vicinities of the opening portions of the metal plate 84 are positioned immediately above the O-rings 90, and the opening portions lock the O-rings 90. In this way, it is possible to prevent the O-rings 90 from being detached.

The metal plate 88 also has a heat dissipation property and dissipates heat from the case body 88.

FIG. 24 shows the structure in which the O-rings 90 are constantly contacted with and locked to the metal plate 84, but the invention is not limited to the structure. For example, the O-ring 90 may be buried at a position lower than the bottom of the case body 82 and may be locked by the bottom structure. In this case, when there is a possibility that the O-ring 90 will be detached, the metal plate 84 locks the O-ring 90, and it is possible to prevent the detachment of the O-ring 90.

Figure 25A:
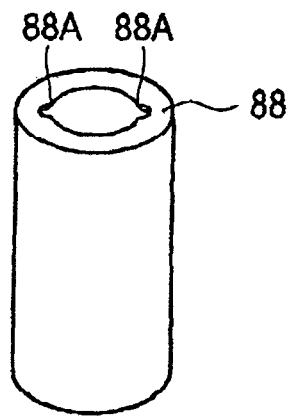
FIG. 25A is a perspective view illustrating the cylinder used in the measuring kit according to the invention.
Figure 25B:
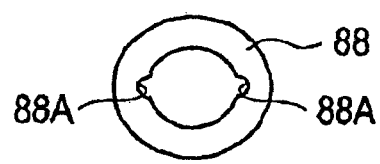
FIG. 25B is a top view illustrating the cylinder shown in FIG. 25A.

The cylinder 88 has cutouts 88A that extend from the opening portion of the cylinder 88 to the bottom as a means for holding the sensor substrate. FIG. 25A is a perspective view illustrating the cylinder 88, and FIG. 25B is a diagrams illustrating the cylinder 88, as viewed from the upper side. Two cutouts 88A are formed on the center line of the opening portion (circular shape) of the cylinder 88, and a segment linking a pair of cutouts 88A has a length that is substantially equal to the width of the sensor substrate. When the sensor substrate is inserted into the opening portion of the cylinder 88 such that the side surface thereof is inserted along the cutouts 88A, it is possible to arrange the sensor substrate at a predetermined position in the cylinder 88.

Figure 26A:
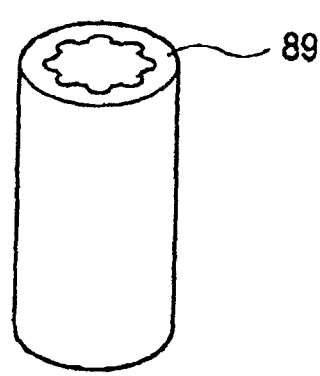
FIG. 26A is a perspective view illustrating a cylinder used in the measuring kit according to the invention which is different from that shown in FIG. 25.
Figure 26B:
FIG. 26B is a top view illustrating the cylinder shown in FIG. 26A.

In FIGS. 23, 25A, and 25B, two cutouts are provided in the cylinder 88, but four or more cutouts may be provided. For example, in a cylinder 89 shown in FIGS. 26A and 26B, eight cutouts are provided. In this case, it is possible to insert the sensor substrate in four directions.

A transparent cover plate 86 is provided at an upper part of the case body 82. The transparent cover plate 86 is provided with circular holes that have substantially the same shape as the opening portion of the circular cylinder 88 such that the upper part of the cylinder 88 protrudes from the transparent cover plate 86 when the cylinder 88 is fixed at a predetermined position of the case body. When a sample is measured with the concave connector substrate 70 being bent, one end of the concave connector substrate 70 comes into contact with the transparent cover plate 86, and the transparent cover plate 86 functions to prevent the wobbling of the concave connector substrate 70. In addition, the transparent cover plate 86 has a function of preventing the cylinder from fluctuating due to a little force applied when a connector with a sensor is connected to a measuring device, in addition to the function of mounting the concave connector substrate. Further, the transparent cover plate 86 has a function of preventing an unnecessary falling object from being mixed with the case body during measurement. For example, water, ice water, or hot water is supplied to the case body 82 in order to adjust the temperature of the sample in the cylinder 88. The transparent cover plate 86 provided on the case body 82 can keep the temperature of the sample. The transparent cover plate 86 is not fixed to the case body 82, but is only placed on the case body 82.

The measuring kit according to the invention is used together with the sensor with a connector obtained by inserting the sensor substrate into the guide/holding region of the concave connector substrate according to the invention, and the usage thereof will be described below. First, the sensor with a connector will be described.

Figure 27A:
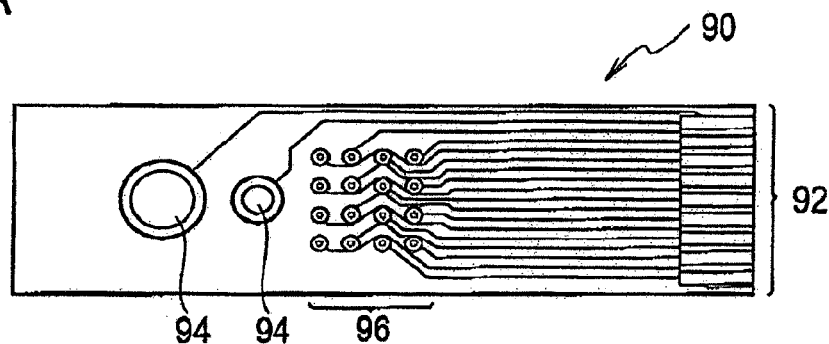
FIG. 27A is a plan view illustrating a sensor substrate that can be used in the concave connector substrate according to the invention.
Figure 27B:
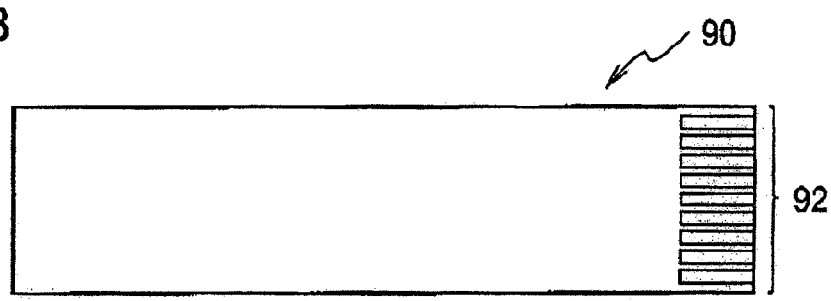
FIG. 27B is a rear view illustrating the concave connector substrate shown in FIG. 27A.

FIG. 27A is a plan view illustrating a sensor substrate 90, and FIG. 27B is a rear view. The sensor substrate 90 includes electrodes 94 and 96 formed only on one surface thereof. The electrodes 94 and 96 are connected to a terminal portion 92 through wiring lines that are buried in the substrate. The electrodes 94 include a large electrode and a small electrode, and the electrodes 96 includes sixteen minute electrodes. A total of eighteen electrodes are provided and connected to eighteen terminals of the terminal portions 92 which are provided on the front surface and the rear surface.

Figure 28:
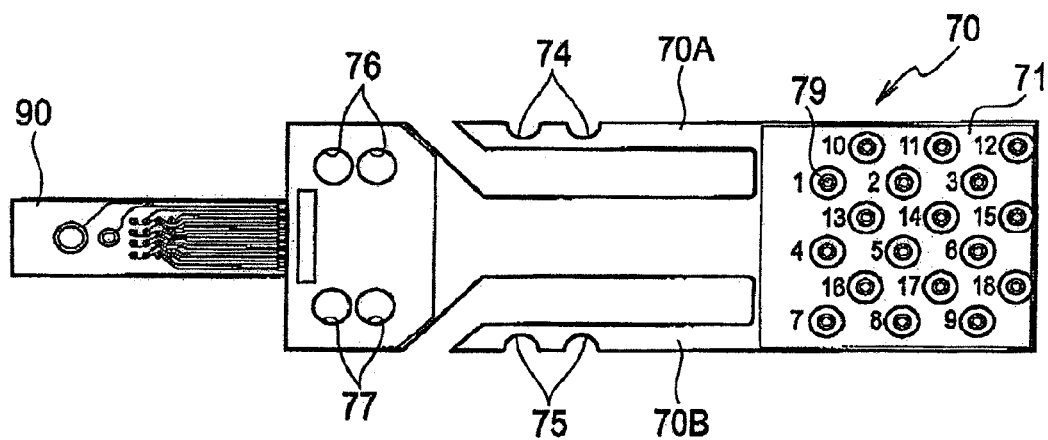
FIG. 28 is a top view illustrating the insertion of the sensor substrate into a concave connector of the concave connector substrate according to the invention.

FIG. 28 shows the insertion of the sensor substrate 90 into the concave connector of the concave connector substrate 70. In this state, for example, even when the sensor substrate 90 is inserted into the cylinder that is provided in the vertical direction to measure a sample, the state of the concave connector substrate 70 with respect to the sensor substrate 90 is largely unstable. However, when the measuring kit according to the invention is used, it is possible to measure a sample in a stable state.

Figure 29:
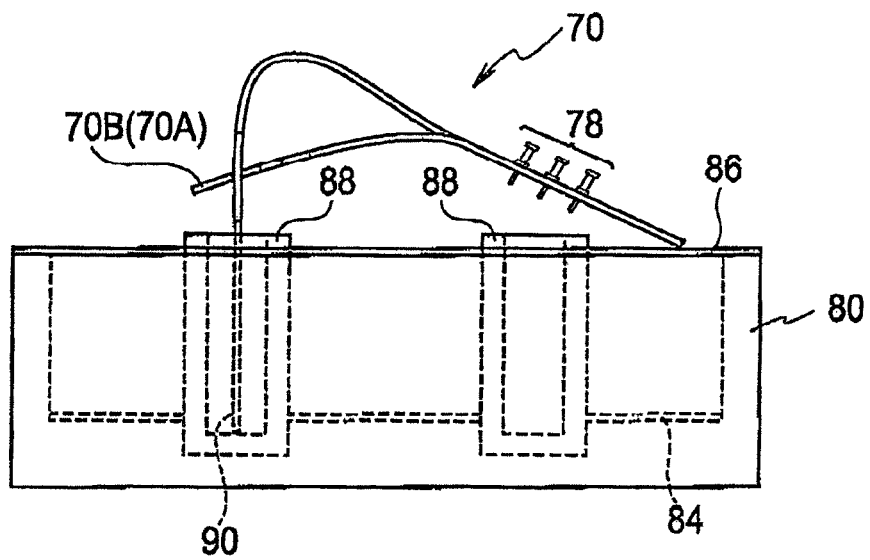
FIG. 29 is a schematic diagram illustrating a state in which the sensor substrate inserted into the concave connector substrate that is bent as shown in FIG. 21 is inserted into the cylinder of the measuring kit to measure a sample.

FIG. 29 shows a state in which the connector substrate 70 of the sensor with a connector is bent at an obtuse angle as shown in FIG. 21 and is inserted into the cylinder 88 provided in the measuring kit 80. In this way, when the sensor with a connector is used to measure a sample, the periphery of the through hole connection region 71 of the concave connector substrate 70 comes into contact with the transparent cover plate 86 and this state can be maintained. Therefore, even when the wiring lines are connected to pins 78 provided in the through hole connection portion through, for example, crocodile clips, it is possible to stabilize the connection without any wobble.

Figure 30:
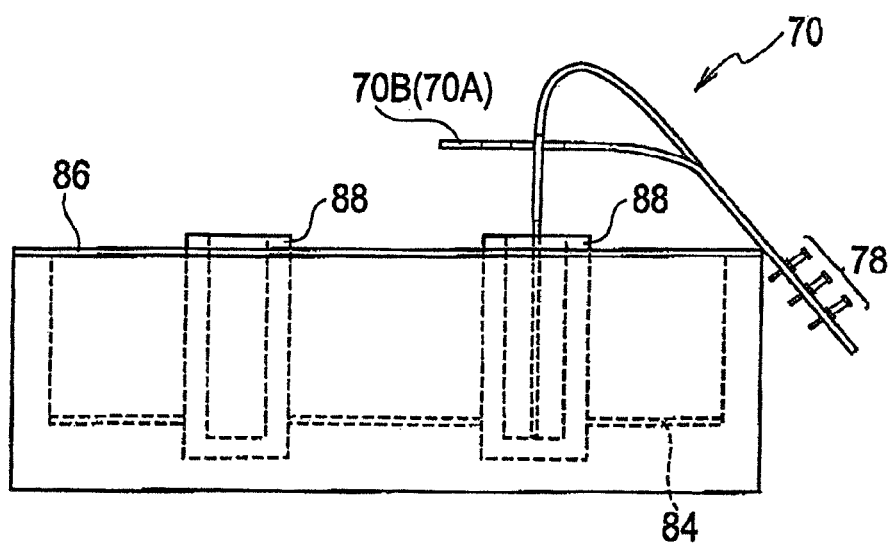
FIG. 30 is a schematic diagram illustrating a state in which the sensor substrate inserted into the concave connector substrate that is bent as shown in FIG. 22 is inserted into the cylinder of the measuring kit to measure a sample.

FIG. 30 shows a state in which the connector substrate 70 of the sensor with a connector is bent at an acute angle as shown in FIG. 22 and is inserted into the cylinder 88 provided in the measuring kit 80. In this state, a portion of the concave connector substrate 70 comes into contact with the transparent cover plate 86, and it is also possible to stabilize the contact without any wobble.

<Sensor Substrate Interpolated Cylinder>

A sensor substrate interpolated cylinder according to the invention includes a sensor substrate that is inserted into the guide/holding region of the above-mentioned concave connector substrate according to the invention and a cylinder into which the sensor substrate is inserted. The cylinder includes a sample feed port through which a sample is introduced into the cylinder and a sealing means that seals an opening portion of the cylinder and the sensor substrate.

Figure 31:
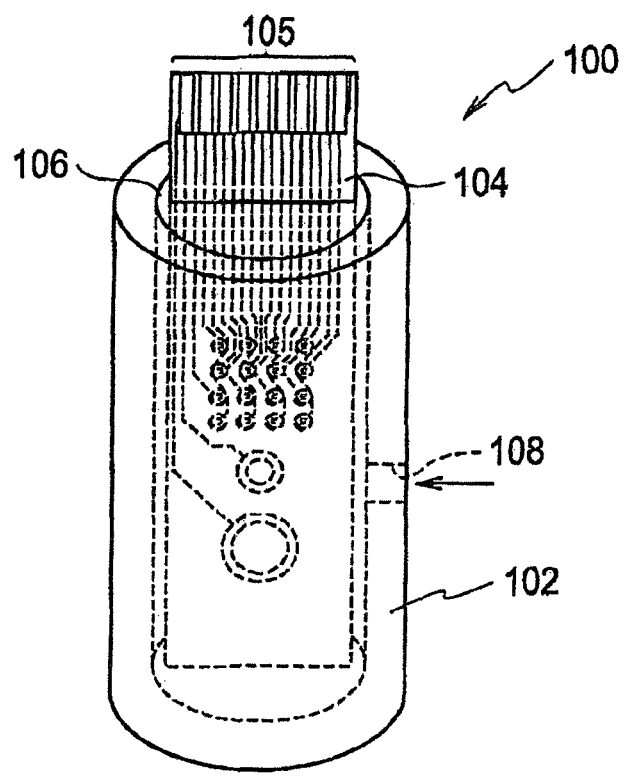
FIG. 31 is a perspective view illustrating a sensor substrate interpolated cylinder according to the invention.

FIG. 31 is a perspective view illustrating an example of the sensor substrate interpolated cylinder according to the invention. A sensor substrate interpolated cylinder 100 shown in FIG. 31 includes a cylinder 102 and a sensor substrate 104 that is inserted into the cylinder 102. A film 106 is provided in the opening portion of the cylinder 102 in order to prevent the leakage of the introduced sample. The film 106 has a cut portion and a terminal portion 105 of the sensor substrate 104 protrudes from the cut portion. It is possible to insert the terminal portion 105 into the guide/holding region of the concave connector substrate. A sample feed port 108 for introducing a sample to be measured into the cylinder is provided in the side surface of the cylinder 102. It is preferable that a check valve for preventing the leakage of the introduced sample due to a counter current be provided in the sample feed port 108. A means for introducing a sample from the sample feed port 108 is not particularly limited. For example, an injector, a dropper, a micropipette, a MEMS, or a small pump that is driven by a small motor may be used to introduce samples.

<Flow Cell>

Figure 32:
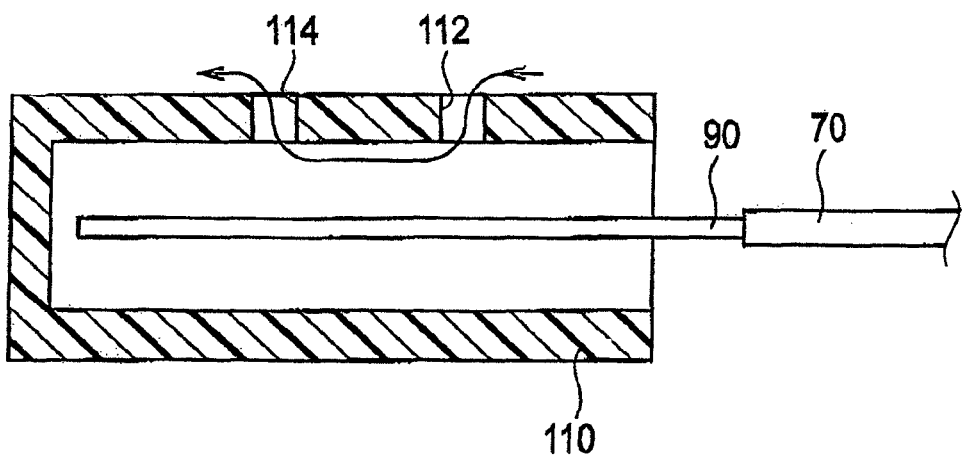
FIG. 32 is a diagram schematically illustrating measurement using a flow cell.

In the above-mentioned structure, the sample that is introduced into the cylinder and is measured does not flow, but remains stationary, and the sample in the stationary state is measured. On the contrary, when a sample liquid is measured in a fluid state, it is preferable to use a flow cell. FIG. 32 is a schematic diagram illustrating the measurement of a flowing sample liquid using a flow cell 110. The concave connector substrate 70 connected to the flow cell 110 into which the sensor substrate 90 is inserted, and the wiring lines are connected to the through hole connection portion of the concave connector substrate 70. The wiring lines are connected to an external measuring device (not shown). The concave connector substrate 70 and the sensor substrate 90 are the same as those shown in FIGS. 19 and 27. The same components as those shown in FIGS. 19 and 27 are denoted by the same reference numerals and a description thereof will be omitted.

The flow cell 110 includes an inlet 112 for introducing a flowing sample and an outlet 114 for discharging the introduced sample. During measurement, a sample is introduced from the inlet 112 of the flow cell 110 and is discharged from the outlet 114 by, for example, a pump. In this way, the sample flows. The electrode of the sensor substrate detects and measures the flowing sample.

In the above-mentioned structures, the sensor substrate is inserted into the cylinder having a sample introduced thereinto to measure the sample. However, for example, when the user wants to measure a small amount of sample in a short time, it is possible to easily measure the sample using the following sensor substrate.

Figure 33A:
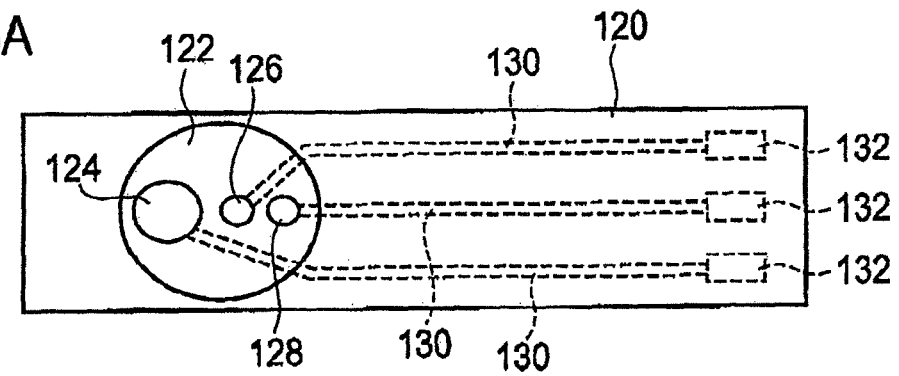
FIG. 33A is a top view illustrating the sensor substrate.
Figure 33B:
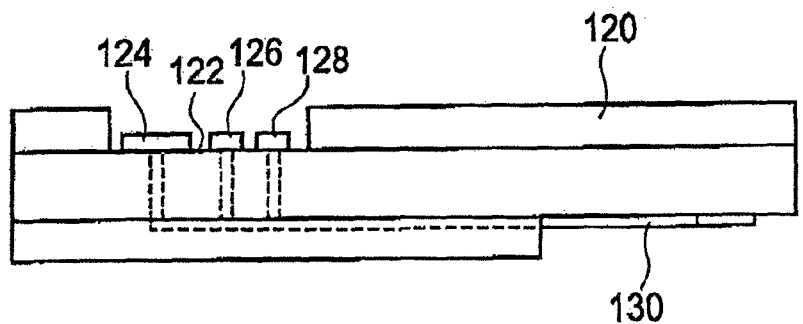
FIG. 33B is a cross-sectional view illustrating the sensor substrate shown in FIG. 33A.

FIG. 33A is a top view illustrating a sensor substrate 120, and FIG. 33B is a cross-sectional view illustrating the sensor substrate 120. The sensor substrate 120 is inserted into the guide/holding region of the concave connector substrate.

The sensor substrate 120 has a concave portion 122 formed in the surface thereof, and includes three electrodes corresponding to a working electrode 128, a counter electrode 124, and a reference electrode 126 in the concave portion 122.

The concave portion 122 is disposed at a depth of 0.025 mm to 10.0 mm from the surrounding surface. The working electrode 128, the counter electrode 124, and the reference electrode 126 disposed in the concave portion 122 are connected to a terminal portion 132 through wiring lines 130 that are buried in the sensor substrate. That is, as shown in FIG. 33B, the wiring lines connected to the three electrodes are buried in the sensor substrate without being exposed from the surface.

In the above-mentioned structure, when a sample is measured, it is possible to measure the sample only by placing the sensor substrate 120 on a horizontal plane and introducing a sample liquid into the concave portion 122. In this case, the amount of introduced sample liquid needs to be sufficient to cover all of the three electrodes in the concave portion 122 at the same time. When the volume of the concave portion 122 is sufficiently small, it is possible to measure a sample by putting a few drops of sample using, for example, a dropper.

In the above-mentioned aspects, the sensor substrate may be used as, for example, a temperature sensor or a pH sensor.

Figure 34:
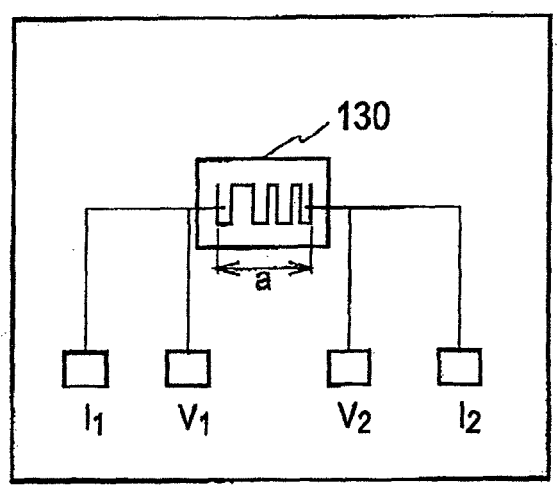
FIG. 34 is a schematic diagram illustrating an example of a structure in which the sensor substrate according to the invention is used as a temperature sensor.

FIG. 34 is a schematic diagram illustrating an aspect in which the sensor substrate is used as a temperature sensor. In FIG. 34, four electrodes ($I_1$, $I_2$, $V_1$, and $V_2$) are connected to a resistor 134. In the structure, the resistance value of the resistor 134 is measured by a 4-terminal method, and the measured resistance value is converted into a temperature using the temperature-change characteristics of the resistance value. In this way, it is possible to obtain the temperature.

In this case, a distance a shown in FIG. 34 is about 5 mm in the resistor 134, and the resistor 134 can be finely formed by electron beam lithography using a positive resist and a lithography method that removes the resist after a metal film is deposited. For example, copper, nickel, or gold may be used as a metal material to be deposited, and it is preferable to use platinum.

The pH sensor can be implemented using a correlation diagram between potential and pH (a potential-pH diagram; Pourbaix diagram). That is, it is possible to measure the potential between an electrode that functions as a reference when it is immersed in a sample and an electrode whose surface potential varies depending on pH using at least two electrodes of the sensor substrate, and calculate pH on the basis of the measured potential, using the potential-pH diagram (Pourbaix diagram) corresponding to metal forming the electrodes. For example, when a gold electrode is used, it is possible to calculate pH for the measured potential from the potential-pH diagram of gold. In this case, the reference electrode may be formed by applying and drying, for example, the carbon paste disclosed in WO/2009/041554. A film made of the carbon paste is characterized in that it has a surface roughness Ra of 20 to 100 nm and has a very flat surface. In this way, the film does not absorb a potential inhibitor, and is stabilized as the reference electrode.

As described above, in the electrode formed by applying and drying the carbon paste, the surface roughness Ra of the film made of the carbon paste is in the range of 20 to 100 nm. However, when the surface roughness Ra is more than 100 nm, the film absorbs the potential inhibitor and is unstable as the reference electrode. It is impossible to produce a film with a surface roughness Ra of less than 20 nm. Even if possible, it is very difficult to produce the film with a surface roughness Ra of less than 20 nm, which is not practical.

It is important that the purity of the gold electrode be high. Therefore, it is preferable that the carbon paste be applied to the wiring lines in the base and dried such that metal is not diffused from the wiring lines below the gold electrode and a gold electrode be deposited thereon. In this way, it is possible to ensure the purity of gold and flatness.

The flatness of (1) the gold electrode formed by plating, (2) the electrode formed by applying and drying carbon paste, ensuring close adhesion, and depositing gold in an oxygen plasma atmosphere, and (3) the electrode formed by applying and drying carbon paste was evaluated.

The evaluation results are shown in the following Table 1.

TABLE 1

| | Kind of electrode | Surface finish | Surface roughness Ra | Remarks |
|---|---|---|---|---|
| (1) | Gold electrode | Plating with nickel and gold etc. | Ra < 1 μm | |
| (2) | Gold electrode | Carbon paste + gold deposition | 50 nm < Ra < 100 nm | |
| (3) | Reference electrode | Carbon paste | Ra < 50 nm | Minimum value: 20 nm |

As can be seen from Table 1, the gold electrode formed by applying carbon paste to the wiring lines in the base, drying it, and depositing gold thereon has a surface roughness Ra of 50 to 100 nm. In addition, it is possible to block the diffusion of metal from the wiring lines in the base using the carbon paste. Therefore, it is possible to prevent a reduction in the purity of gold in the gold electrode. That is, the use of the carbon paste makes it possible to improve flatness and the purity of gold.

Similarly, when the reference electrode is made of carbon paste, it is possible to obtain high flatness.

The two electrodes are not necessarily arranged on the same surface of the substrate, but may be arranged on both surfaces of an insulating base. In all of the sensor substrates according to the invention, as such, the electrodes are not necessarily provided in the same plane.

For example, it has been known that, as the distance between the reference electrode and the working electrode is reduced, sensitivity is improved. Therefore, it is preferable that the working electrode and the counter electrode be arranged on the same surface, the reference electrode be arranged in the vicinity of a position opposite to the working electrode on the rear surface, and a through hole passing through the vicinities of the working electrode and the reference electrode be provided in the base. The through hole is provided in order to ensure the flow path of a sample liquid between the front surface and the rear surface of the sensor substrate. According to the above-mentioned structure, the sample liquid can pass between the working electrode and the reference electrode through the through hole at a short distance. Therefore, the distance between the electrodes is substantially reduced, and it is possible to ensure the sensitivity or reproducibility of a sensor and simplify a manufacturing process. This structure is also implemented by the concave connector substrate according to the invention in which, even though the terminal portions of the sensor substrate are arranged on both surfaces, connection is available.

DESCRIPTION OF NUMERALS

1: BASE (GUIDE SUBSTRATE)
1A, 1B: SECTION
2A, 2B: CUT PORTION
3: POSITIONING GUIDE PATTERN
4: DUMMY ELECTRODE TERMINAL PATTERN
5: INDIVIDUAL OUTLINE DATA FRAME (OUTLINE)
6: ALLOCATED INDIVIDUAL DATA FRAME (REGION IN WHICH SINGLE DATA IS DESIGNED)
7: WIRING LINE
8: WIRING SUBSTRATE
8A, 8B: DEFECTIVE PORTION
9: REGION IN WHICH NO ADHESIVE IS APPLIED (GUIDE SUBSTRATE SECTION)
10: BASE DEFORMING WINDOW (WINDOW)
11: REMOVAL LINE FOR REMOVING SECTION OF GUIDE SUBSTRATE (OUTLINE REMOVAL LINE)
12: ADHESIVE LAYER
13: CUSHION MEMBER (PLATE-SHAPED LOW-ELASTICITY BASE)
14: SUS PLATE
15: METAL LAYER
16A, 16B: GUIDE/HOLDING REGION
20, 90, 120: SENSOR SUBSTRATE (PLATE-SHAPED CONNECTOR)
22, 92: TERMINAL PORTION
30, 71: THROUGH HOLE CONNECTION REGION
32: THROUGH HOLE CONNECTION PORTION
34, 78: PIN
40: CASE
50, 52, 62, 70: CONCAVE CONNECTOR SUBSTRATE
52A, 52B, 62A, 62B, 70A, 70B: NON-COMPLIANT REGION
54, 55, 58, 59, 68, 69, 74, 75: CUTOUT
56, 57, 66, 67, 72, 73: CUT PORTION
64, 65, 76, 77: ENGAGING HOLE
80: MEASURING KIT
82: CASE BODY
84: METAL PLATE
86: TRANSPARENT COVER PLATE
88: CYLINDER
88A: CUTOUT
94: (LARGE AND SMALL) ELECTRODE
96: MINUTE ELECTRODE
100: SENSOR SUBSTRATE INTERPOLATED CYLINDER
102: CYLINDER
104: SENSOR SUBSTRATE
106: FILM
110: FLOW CELL
122: CONCAVE PORTION
124: COUNTER ELECTRODE
126: REFERENCE ELECTRODE
128: WORKING ELECTRODE
134: RESISTOR

The invention claimed is:
1. A method of manufacturing a concave connector substrate comprising:
   preparing a guide substrate having a guide/holding region that guides a plate-shaped connector provided with an electronic device to be connected to a connection position and holds the plate-shaped connector at the connection position and a cut portion for removing a section having a shape corresponding to the guide/holding region;

arranging and aligning two wiring substrates, each having wiring lines obtained by integrating connector terminals with cables, a metal layer that is provided on one surface opposite to a surface having the wiring lines formed thereon, and a window that is provided in a region of the metal layer facing the connector terminals, with both surfaces of the guide substrate such that the surface having the wiring lines formed thereon faces the guide substrate, and applying an adhesive to a region of the guide substrate other than the inside of the cut portion to bond the wiring substrates to the guide substrate;

pressing a base surface of at least one wiring substrate of the two wiring substrates exposed from the window to bend the wiring substrate and bringing the wiring lines disposed in the bent portion into pressure contact with the inside of the cut portion; and removing the section inside the cut portion to form the guide/holding region, wherein a thickness of the section of the guide substrate is set to be less than a maximum thickness of the plate-shaped connector.

2. The method of manufacturing a concave connector substrate according to claim 1, wherein a dummy conductor pattern corresponding to a conductor pattern of the plate-shaped connector is formed in the section of the guide substrate, and a portion of the entire dummy conductor pattern in the section of the guide substrate is removed.

3. The method of manufacturing a concave connector substrate according to claim 1, wherein a dummy conductor pattern corresponding to a conductor pattern of the plate-shaped connector is formed in the section of the guide substrate, and the thickness of the dummy conductor pattern in the section of the guide substrate is less than that of the conductor pattern of the plate-shaped connector.

4. The method of manufacturing a concave connector substrate according to claim 1, wherein a plate-shaped low-elasticity base is provided outside the wiring substrate in a laminated direction, and the base surface of the wiring substrate exposed from the window is pressed through the plate-shaped low-elasticity base to bend the wiring substrate.

5. The method of manufacturing a concave connector substrate according to claim 1, wherein the wiring substrate is obtained by forming wiring lines on a base made of a thermosetting resin, a light-curable resin, or a thermoplastic resin.

* * * * *